US011315923B2

(12) United States Patent
Reznicek et al.

(10) Patent No.: US 11,315,923 B2
(45) Date of Patent: Apr. 26, 2022

(54) STACKED NANOSHEET INVERTER

(71) Applicant: International Business Machines Corporation, Armonk, NY (US)

(72) Inventors: Alexander Reznicek, Troy, NY (US); Karthik Balakrishnan, Scarsdale, NY (US); Bahman Hekmatshoartabari, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/023,891

(22) Filed: Sep. 17, 2020

(65) Prior Publication Data

US 2022/0085013 A1    Mar. 17, 2022

(51) Int. Cl.
*H01L 21/02*    (2006.01)
*H01L 21/8238*    (2006.01)
(Continued)

(52) U.S. Cl.
CPC .... *H01L 27/0922* (2013.01); *H01L 21/02603* (2013.01); *H01L 21/823807* (2013.01);
(Continued)

(58) Field of Classification Search
CPC ....... H01L 21/02603; H01L 21/823807; H01L 21/823814; H01L 21/823864;
(Continued)

(56) References Cited

U.S. PATENT DOCUMENTS 10,002,803 B2    6/2018  Cheng et al.
2017/0148922 A1    5/2017  Hatcher et al.
(Continued)

FOREIGN PATENT DOCUMENTS

WO    WO2016057973    4/2016

*Primary Examiner* — Tong-Ho Kim
(74) *Attorney, Agent, or Firm* — Daniel P. Morris; Randall Bluestone; Lou Percello, Attorney, PLLC

(57) ABSTRACT

A cross-coupled inverter made of nanolayers from a nanosheet stack structure has a left field effect transistor (FET) stack and a right FET stack. The left FET stack has a second left FET stacked on a first left FET. The first and second left FETs have opposite types. The right FET stack has a second right FET stacked on a first right FET. The first and second right FETs have opposite types. The first left and first right FET have a first common source drain (S/D). The left FET stack has a left gate stack surrounding the one or more first left FET channel layers and the one or more second left FET channel layers. The right FET stack has a right gate stack surrounding the one or more first right FET channel layers and the one or more second right FET channel layers. In some embodiments the left/right gate stack has a left/right center gate stack layer and one or more left/right gate stack layers. The center gate stack layers are thicker than the gate stack layers and are between the first and second FETs. The insulating layer surrounds the middle of the center gate stack layers. The first right FET S/D and the second right FET S/D are internally and electrically connected and connected to a Q external connection. The Q external connection is externally connected to the left gate stack. The first left FET S/D and the second left FET S/D are internally, electrically connected together and connected to a QB external connection. The QB external connection is externally connected to the right gate stack.

During operation, the first common S/D is connected to a first external power contact and the second common S/D is connected to a second external power contact and the Q external connection has a logically opposite value of the QB external connection during a desired operation phase. Chip area is reduced because of the low number of external connections required to wire the cross-coupled inverter device.

20 Claims, 16 Drawing Sheets

(51) Int. Cl.
*H01L 23/528* (2006.01)
*H01L 27/092* (2006.01)
*H01L 29/06* (2006.01)
*H01L 29/417* (2006.01)
*H01L 29/423* (2006.01)
*H01L 29/49* (2006.01)
*H01L 29/66* (2006.01)
*H01L 29/786* (2006.01)

(52) U.S. Cl.
CPC .............. *H01L 21/823814* (2013.01); *H01L 21/823864* (2013.01); *H01L 21/823878* (2013.01); *H01L 23/5286* (2013.01); *H01L 29/0673* (2013.01); *H01L 29/41733* (2013.01); *H01L 29/42392* (2013.01); *H01L 29/4908* (2013.01); *H01L 29/66545* (2013.01); *H01L 29/66553* (2013.01); *H01L 29/66742* (2013.01); *H01L 29/78618* (2013.01); *H01L 29/78696* (2013.01)

(58) Field of Classification Search
CPC ......... H01L 21/823878; H01L 23/5286; H01L 27/0922; H01L 29/0673; H01L 29/41733; H01L 29/42392; H01L 29/4908; H01L 29/66545; H01L 29/66553; H01L 29/66742; H01L 29/78618; H01L 29/78696
USPC ......................................................... 257/351
See application file for complete search history.

(56) References Cited

U.S. PATENT DOCUMENTS

2018/0190835 A1* 7/2018 Lee ..................... H01L 29/1025
2019/0319095 A1* 10/2019 Zhang ................. H01L 27/1203

* cited by examiner

STACKED NANOSHEET INVERTER

BACKGROUND

The present invention relates to electronic circuitry components. More specifically, the invention relates to stack nanosheet inverters, cross-coupled inverters, and methods of making these inverters.

A nanosheet is a thin semiconductor layer. Nanosheets are layered together to form nanosheet stacks.

Nanosheet technology is being pursed as a viable option for making devices targeted for 5 to 3 nanometer (nm) technology and beyond in Complementary Metal Oxide Semiconductor (CMOS) device architectures. Nanosheet stacks are used in the fabrication of Field Effect Transistors (FETs). Nanosheet technology can be used to stack FETs, e.g. to stack NFETs and PFETs on top of each other.

Inverters and cross-coupled inverter pairs are essential building blocks for designing many circuits, such as Static Random-Access Memory (SRAM) cells, comparators, and sense amplifiers.

There is a need for effective nanosheet inverter structures and methods of making nanosheet inverters using nanofabrication technology. In addition, there is a need for methods and structures that enable tight integration of cross-coupled nanosheet inverters for achieving high density and high-speed circuits.

SUMMARY

According to an embodiment of the present invention, a cross-coupled inverter made of nanolayers from a nanosheet stack preliminary structure is comprised of a left field effect transistor (FET) stack and a right FET stack.

The left FET stack has a first left FET with a first type. The first left FET has one or more first left FET channel layers connected in parallel between a first left FET source drain (S/D) and a first common S/D.

A second left FET is stacked on the first left FET in the left FET stack and has a second type that is opposite the first type. The second left FET has one or more second left FET channel layers connected in parallel between a second left FET S/D and a second common S/D. The first left FET S/D and the second left FET S/D are connected to a common QB external connection.

There is an insulating layer disposed on the first left FET source drain (S/D) and the first common S/D that electrically isolates the first left FET and the second left FET.

In addition, the left FET stack has a single left gate stack surrounding all of the one or more first left FET channel layers and all of the one or more second left FET channel layers.

The right field effect transistor (FET) stack has a first right FET with the first type. The first right FET has one or more first right FET channel layers connected in parallel between a first right FET S/D and the first common S/D. The same insulating layer is also disposed on the first right FET S/D.

A second right FET is stacked on the first right FET in the right FET stack and has the second type. The second right FET has one or more second right FET channel layers connected in parallel between a second right FET S/D and the second common S/D. The first right FET S/D and the second right FET S/D are connected to a common Q external connection.

The right FET stack has a single right gate stack surrounding all of the one or more first right FET channel layers and all of the one or more second right FET channel layers.

The left gate stack is connected to the common Q external connection and the right gate stack is connected to the common QB external connection.

During operation in some embodiments, the first common S/D is connected to a first external power contact and the second common S/D is connected to a second external ground contact. At least during a portion of the operation time, the Q external connection has a logically opposite value of the QB external connection.

In some embodiments, the first left FET and the first right FET are PFETs, the second left FET and the second right FET are NFETs, the first external power contact is connected to a positive voltage source, and the second external power contact is connected to either a negative voltage source or ground.

Methods of making inverters from nanosheet stacks are disclosed.

BRIEF DESCRIPTION OF THE DRAWINGS

Various embodiments of the present invention will be described below in more detail, with reference to the accompanying drawings, now briefly described. The Figures show various apparatus, structures, and related method steps of the present invention.

DETAILED DESCRIPTION

Figure 1:
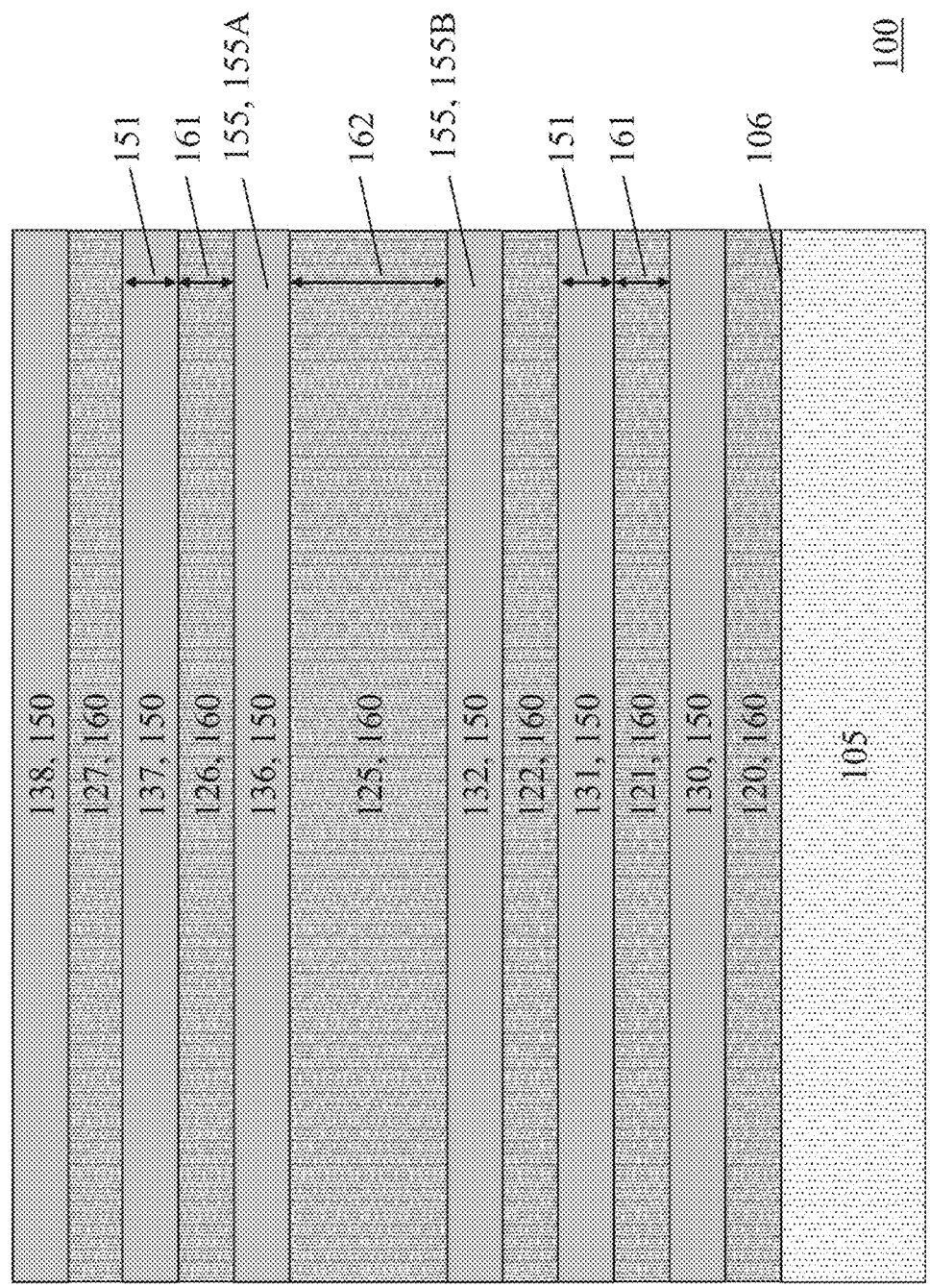
FIG. 1 is a cross-section view of an interim layered structure comprised of a nanosheet stack.

It is to be understood that embodiments of the present invention are not limited to the illustrative methods, apparatus, structures, systems and devices disclosed herein but instead are more broadly applicable to other alternative and broader methods, apparatus, structures, systems and devices that become evident to those skilled in the art given this disclosure.

In addition, it is to be understood that the various layers, structures, and/or regions shown in the accompanying drawings are not drawn to scale, and that one or more layers, structures, and/or regions of a type commonly used may not be explicitly shown in a given drawing. This does not imply that the layers, structures, and/or regions not explicitly shown are omitted from the actual devices.

In addition, certain elements may be left out of a view for the sake of clarity and/or simplicity when explanations are not necessarily focused on such omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices, structures, and methods disclosed in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, expert and artificial intelligence systems, functional circuitry, neural networks, etc. Systems and hardware incorporating the semiconductor devices and structures are contemplated embodiments of the invention.

As used herein, "height" refers to a vertical size of an element (e.g., a layer, trench, hole, opening, etc.) in the cross-sectional or elevation views measured from a bottom surface to a top surface of the element, and/or measured with respect to a surface on which the element is located.

Conversely, a "depth" refers to a vertical size of an element (e.g., a layer, trench, hole, opening, etc.) in the cross-sectional or elevation views measured from a top surface to a bottom surface of the element. Terms such as "thick", "thickness", "thin" or derivatives thereof may be used in place of "height" where indicated.

As used herein, "lateral," "lateral side," "side," and "lateral surface" refer to a side surface of an element (e.g., a layer, opening, etc.), such as a left or right-side surface in the drawings.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the elevation views, and "horizontal" refers to a direction parallel to the top surface of the substrate in the elevation views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop," "disposed on," or the terms "in contact" or "direct contact" means that a first element and a second element are connected without any intervening elements, such as, for example, intermediary conducting, insulating or semiconductor layers, present between the first element and the second element.

It is understood that these terms might be affected by the orientation of the device described. For example, while the meaning of these descriptions might change if the device was rotated upside down, the descriptions remain valid because they describe relative relationships between features of the invention.

Embodiments of the present invention include methods and structures for forming a stacked nanosheet inverter. In some embodiments the inverter is a cross-coupled inverter pair with NFET and PFET stacked vertically in a stacked nanosheet architecture. Internal connections between the NFETs and PFETs are formed and buried within the structures to save chip area.

The figures present a series of interim structures and different method steps which lead to embodiments of one or more of the nanosheet inverters. In one non-limiting example embodiment, a nanosheet stack with a novel structure is patterned with a pair of dummy gate structures, each within a gate spacer. A source/drain (S/D) recess or etch is performed to form a pair of stacks (stack pair), each with channel layers and dummy gate layers. Inner spacers are formed at the exposed ends of the dummy gate layers. In some embodiments a dielectric isolation layer is formed between the spacer stack pair and a substrate. A first S/D layer with a first doping type is grown, surrounding the spacer stack pair and then recessed. An electrically insulating, separation layer is deposited on the first S/D layer. A second S/D layer with a second doping type is grown on the separation layer, surrounding the spacer stack pair. After an interlayer deposition (ILD) fill, the dummy gates are removed and the channels are released. A gate stack is formed for each spacer stack pair and external connections are made. Chip area is saved since many of the inverter connections are internal due to the configuration of the structure which minimizes the size and number of connections.

Various embodiments of "all-around" gates are disclosed. For example, all-around gates can be gates in direct contact (interface) with a top, bottom, front, and back surfaces of one or more channels. In embodiments where the gates are one unified structure surrounding ("all-around") all of each of the individual parallel channels in each spacer stack pair are controlled by the one unified gate. In these configurations, the channels in each spacer stack pair are subject to substantially the same gate voltage at the same time.

Refer now to the Figures.

FIG. 1 is a cross-section view of an interim layered structure 100, e.g. a nanosheet stack. The beginning structure 100 is a layer of nanosheets disposed on a substrate 105. Each nanosheet (120, 130, 121, 131, 122, 132, 125, 126, 136, 137, 127, and 138) is either a channel layer (130, 131, 132, 136, 137, and 138, typically 150) or an all-around dummy gate layer (120, 121, 122, 125, 126, and 127, typically 160). The channel layers 150 and all-around dummy gate layers 160 alternate, one disposed on the other by known techniques, to form the layers of nanosheet structure 100.

In some embodiments, a center dummy gate layer 125/160 is disposed in the center of the nanosheet structure 100. In some embodiments, the center dummy gate layer 125 is thicker 162 than the other layers 150/160.

In alternative embodiments, a dielectric isolation layer (306, see below) is disposed on the surface 106 of the substrate 105 between the substrate 105 and the first layer 120/160.

The substrate 105 can be made from an elemental semiconductor (e.g., silicon or germanium); primarily a single element (e.g., a doped material), for example doped silicon; or a compound semiconductor, for example, gallium arsenide (GaAs); or a semiconductor alloy, for example silicon-germanium (SiGe). Non-limiting examples of the substrate 105 materials include one or more semiconductor materials like silicon (Si), silicon-germanium (SiGe), Si:C (carbon doped silicon), germanium (Ge), carbon doped silicon germanium (SiGe:C), Si alloys, Ge alloys, III-V materials (e.g., GaAs, Indium gallium arsenide (InGaAs), indium arsenide (InAs), indium phosphide (InP), aluminum arsenide (AlAs), etc.), II-V materials (e.g., cadmium selenide (CdSe), cadmium sulfide (CdS), or any combination thereof), or other like semiconductors. In addition, multiple layers of the semiconductor materials can make up the substrate 105. In some embodiments, the substrate 105 includes both semiconductor materials and dielectric materials. In some silicon on insulator (SOI) implementations, a buried oxide layer, BOX, (e.g., SiO2) is buried in the substrate 105.

The channel layers 150 are made of a semiconductor material. In some embodiments, the channel layers 150 are made of silicon (Si). Other materials are envisioned.

In some embodiments, the channel layers 150 have a channel layer 150 thickness 151 ranging between 5 and 12 nanometers (nm), in some embodiments the range is between 6 and 8 nm.

The channel layers 150 are undoped 155, lightly doped 155 or moderately doped 155. In some embodiments, the channel layers (150, 130, 131, and 132) below the center dummy gate layer 125/160 are doped 155 with a first channel dopant 155B of opposite type 155B than a second channel dopant 155A that dopes the channel layers (150, 136, 137, and 138) above the center dummy gate layer 125/160. For example, in some embodiments, the channel layers (150, 130, 131, and 132) below the center dummy gate layer 125/160 are doped 155 with a first channel dopant 155B, e.g. an n-type dopant 155B, and, the channel layers (150, 136, 137, and 138) above the center dummy gate layer 125/160 are doped 155 with a second channel dopant 155A, e.g. a p-type dopant 155A.

If the channel layers 150 are p-type doped, dopants can be selected from a non-limited group of boron (B), gallium (Ga), indium (In), and thallium (Tl). If the channel layers 150 are n-type doped, dopants can be selected from a non-limited group of phosphorus (P), arsenic (As) and antimony (Sb).

Channel layer 150 channel doping levels/concentrations vary. For example, for a p-type doping, the channel layers 150 can be doped, e.g. with boron (B), with a concentration between $1 \times 10^{17}$ cm$^{-3}$ and $1 \times 10^{19}$ cm$^{-3}$. For an n-type doping, the channel layers 150 can be doped, e.g. with phosphorous (P), with a concentration between $1 \times 10^{17}$ cm$^{-3}$ and $1 \times 10^{19}$ cm$^{-3}$. Other channel doping levels/concentrations 155 and channel layer thicknesses 151 are possible.

The all-around dummy gate layers 160 are made of sacrificial material that can be removed by processes that do not affect other materials of the structure 100, e.g. materials making the substrate 105 and channel layers 150. In some embodiments, the all-around dummy gate layers 160 are made of silicon-germanium (SiGe).

The thicknesses 161 of the all-around dummy gate layers 160 are between 6 nm and 20 nm, with some embodiments between 6 nm to 8 nm. Other thicknesses are possible.

In some embodiments, the thickness 162 of the center dummy gate layer 125/160 is larger than the thicknesses of the other layers 150/160. In some embodiments, the center dummy gate layer 125/160 is between 10 nm and 100 nm or between 20 nm and 50 nm. Other thicknesses are possible.

In some embodiments, the nanosheet layers 150/160 are epitaxially grown on top of one another. The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface.

In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, each semiconductor layer of the epitaxial semiconductor material stack has the same crystalline characteristics as the deposition surface on which it is formed.

Examples of various epitaxial growth process apparatuses that can be employed in the present invention include, for example, rapid thermal chemical vapor deposition (RT-CVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C.

In some embodiments, the gas source for the epitaxial growth may include a silicon containing gas source and/or an admixture of a germanium containing gas source. Examples of silicon gas sources include silane, disilane, trisilane, tetrasilane, hexachlorodisilane, tetrachlorosilane, dichlorosilane, trichlorosilane, and combinations thereof. Examples of germanium gas sources include germane, digermane, or combinations thereof. In some embodiments, an epitaxial SiGe alloy can be formed from a source gas that includes a compound containing silicon and germanium. Carrier gases like hydrogen, helium, and argon can be used. During the epitaxial growth of a layer an appropriate type dopant can be added to the precursor gas or gas mixture.

In some embodiments of channel layer 150 materials, no dopant is present in, or added into, the precursor gas or gas mixture. In other embodiments, the channel layers 150 are doped with a dopant in the gas mixture but at a lower doping concentration than that used to grow the first and second S/D layer, as described below.

In one embodiment, layers 150/160 are grown by an integrated epitaxy process. In an integrated epitaxy process the structure is epitaxially grown continuously while the type of gas source and type and/or the concentration of dopants changes at different times and time periods to create the different layers with different dopants and dopant concentrations. Some temperature adjustments may be made for one or more of the layers during the epitaxial growth as well.

The nanosheet layers 150/160 are grown on top of one another as described below to complete the structure 100. The grown channel layers 150 can be in-situ doped, meaning dopants are incorporated into the epitaxy layers during the growth/deposition of the respective epitaxial channel layer 150.

In some embodiments, the source gas is changed to create the all-around dummy gate layers 160. Typically, the all-around dummy gate layers 160 are not doped. Doping of the all-around dummy gate layers 160 is inconsequential because these layers 160 are sacrificial.

In some embodiments, 2 or 3 channel layers 150 below and 2 or 3 channel layers 150 above the center dummy gate layer 125/160 are formed. Formation of more channel layers 150 above and/or below the center dummy gate layer 125/160 are possible.

Creating the structure 100 by epitaxial growing nanolayers 150/160 allows for accurate control of nanolayer 150/160 thickness 151/161/162 and doping levels. Further, there is no alignment of layers needed during the nanolayer 150/160 growth.

Figure 2:
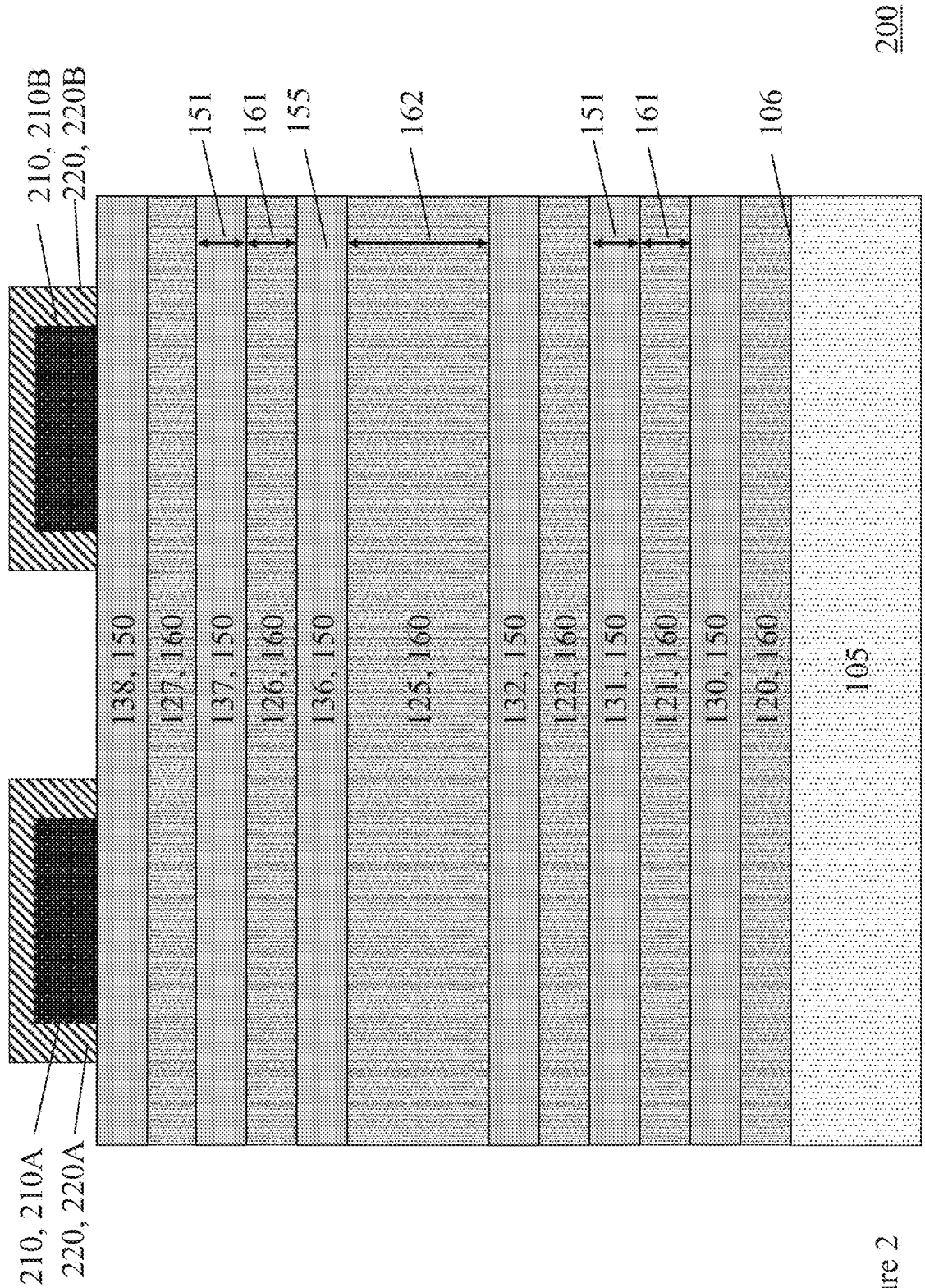
FIG. 2 is the cross-section view of a pair of dummy gates and a pair of gate spacers patterned on the interim structure of FIG. 1.

FIG. 2 is the cross-section view 200 of a pair (210A, 210B) of dummy gates 210 and a pair (220A, 220B) of gate spacers 220 patterned on the interim structure 100.

The dummy gate 210 and gate spacer 220 are formed by well-known methods. For example, the dummy gate material 210 is deposited and patterned using a hard mask. After hard mask removal the gate spacer material 220 is conformally deposited and a directional etch back is performed. The dummy gates 210 are made of a sacrificial material that is selectively different chemically from the gate spacer 220 material. The dummy gates 200 and gate spacers 220 are not drawn to scale.

The dummy gate 210 material can include, for example, amorphous silicon (α-Si) or polycrystalline silicon (polysilicon). In some embodiments, the dummy gate material is the same material as the all-around dummy gate layers 160, e.g. SiGe. The dummy gate 210 material may be deposited by a deposition process, including, but not limited to, physical vapor deposition (PVD), chemical vapor deposition (CVD), and plasma enhanced chemical vapor deposition (PECVD). The dummy gate 210 has a thickness of about 50 nm to about 200 nm, or 100 nm to 150 nm. Other thicknesses are possible.

The gate spacer 220 material can be deposited by known techniques like PVD, CVD, or atomic layer deposition (ALD) and can be made of materials like silicon nitride (SiN), silicon boron nitride (SiBN), siliconborocarbonitride (SiBCN), silicon oxycarbonitride (SiOCN), dielectric oxynitrides, or dielectric oxides like silicon oxide (SiOx). The thickness of the gate spacer 220 can be between 3 nm to 15 nm, although other thicknesses are possible. In some embodiments, the gate spacer 220 is made of SiN.

Figure 3:
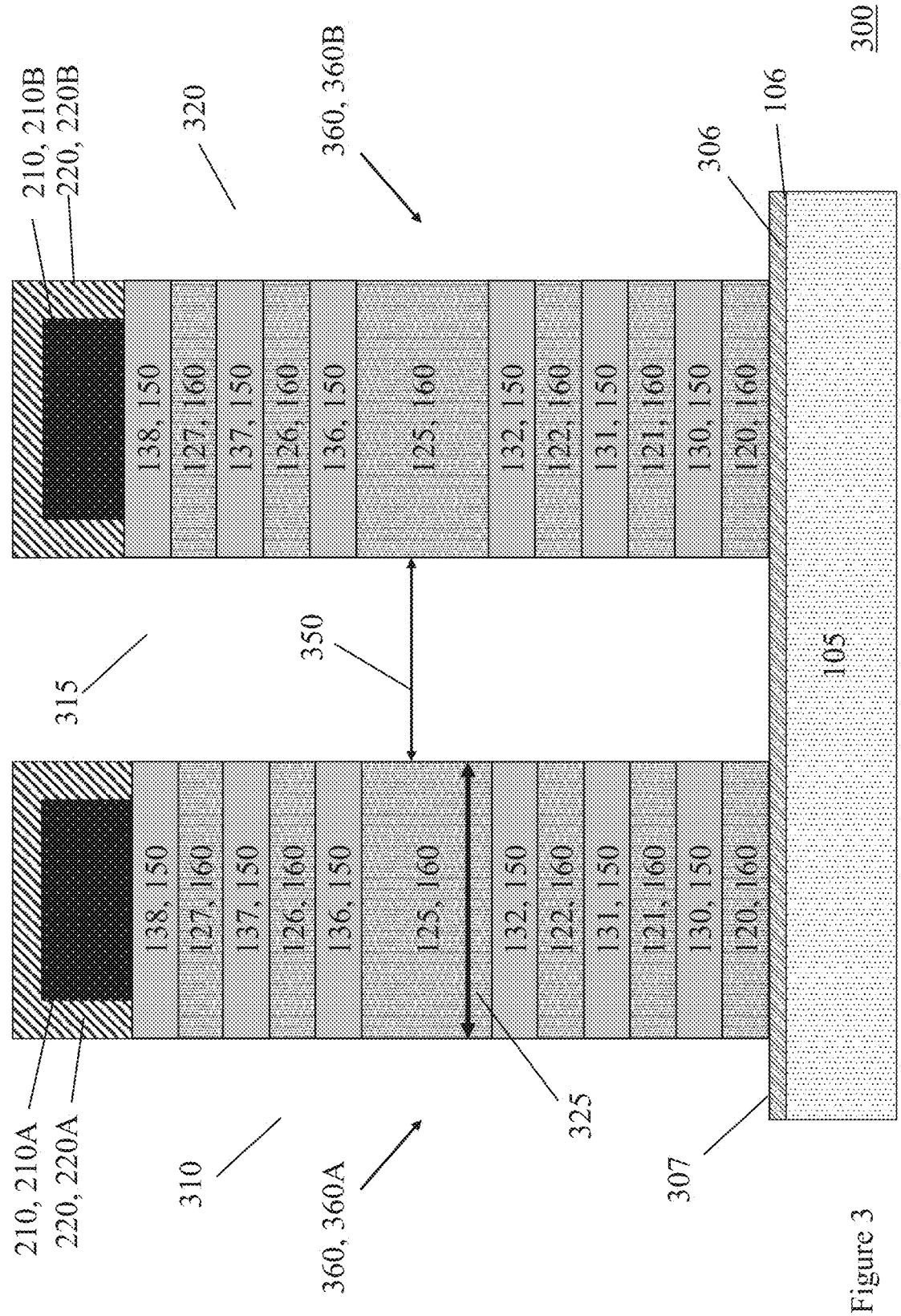
FIG. 3 is a cross-section view of an interim layered nanosheet structure with regions removed to form a pair of stacks.

FIG. 3 is a cross-section view of an interim structure 300 of a pair of stacks 360 with regions (310, 315, 320) removed to enable growth of a first and a second source/drain region, as described below. For example, regions between 315 the pair of stacks 360 and beside (310, 320) the stacks will be void of material above the substrate 105 and/or the dielectric isolation layer 306. In some embodiments, the dielectric isolation layer 306 is deposited on the surface 106 of the substrate 105 before the channel 150 and dummy gate 160 layers are grown. In other embodiments, a volume beneath the interim nanosheet structure 100 is etched away from the surface 106 of the substrate 105 and a dielectric is deposited.

In some embodiments, a flowable oxide, FOX, is used to form the dielectric insolation layer 306 after the etching of the substrate 105 surface 106.

In some embodiments, the gate spacers 220 are used as masks in a directional reactive ion etch (RIE) process that etches the nanolayers 150/160 away in regions 310, 315, and 320 while leaving a pair (360A, 360B) of stacks (stack pair) 360 of the nanolayers 150/160 under each of the gate spacers 220. In some embodiments, the RIE etching is a series of different RIEs as required for the chemistry of the layer(s) 150/160 being removed. The RIE stops when the surface 305 of the substrate 105 or the isolation layer surface 307 of the dielectric isolation layer 306 is reached, using known techniques like end point detection, i.e. monitoring when the material of the last removed layer 120 stops being detected.

Each of the pair 360A/360B of stacks 360 has a plurality of channel layers 150 and dummy gate layers 160. The channels 150 and dummy gate layers 160 have a stack pair width 325 in each stack pair 360A/360B. The stacks 360A/360B are separated by a pair separation distance 350 between 10 and 30 nm. The stack pair 360 width 325 is between 25 and 100 nm. Other dimensions are envisioned.

Figure 4:
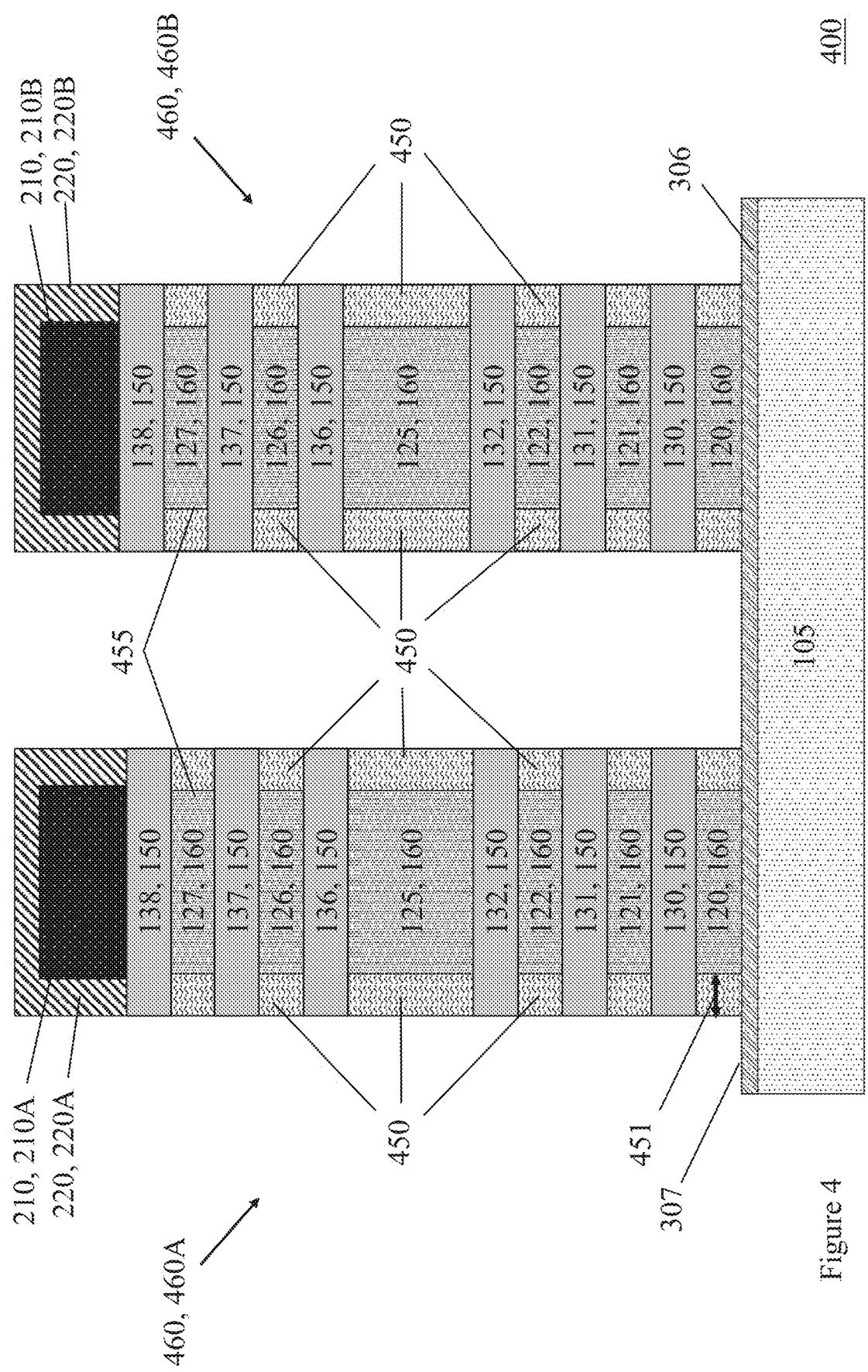
FIG. 4 is a cross-section view of an interim structure with inner spacers formed on each of a pair of spacer stacks.

FIG. 4 is a cross-section view of an interim structure 400 with inner spacers 450 creating a pair (460A, 460B) of spacer stacks (spacer stack pair) 460. The inner spacers 450 are formed at the etched back ends, typically 455, of each all-around dummy gate layer 160 and protect the all-around dummy gate layer 160 in some of the next processing steps.

Inner spacer 450 formation begins with a partial etch back of the all-around dummy gate layers 160. The etch back chemistry selectively removes the material, e.g. SiGe, in the all-around dummy gate layers 160 and does not affect the materials in the channel layers 150, gate spacers 220, or dummy gates 210. For example, the structure 300 is exposed for a timed period to known chemistries like a gaseous HCl. There are other available etch back methods, e.g. developed by TEL, Tokyo Electron Ltd.

The length of the time is determined empirically to recess the ends 455 of the all-around dummy gate layers 160 the required distance/thickness 451.

After the ends 455 are recessed, the inner spacer 450 material is conformally deposited. Known processes (e.g. a masked directional etch) re-define the sides of the spacer stacks 460 and remove spacer material from the isolation layer surface 307 of the dielectric isolation layer 306.

Inner spacer 450 materials and deposition techniques can be those used in formation of the gate spacer 220. In some embodiments, the inner spacers 450 are made of silicon nitride (SiN). The thickness 451 of the inner spacers 450 is between 3 nm and 8 nm. Other thicknesses are possible.

Figure 5:
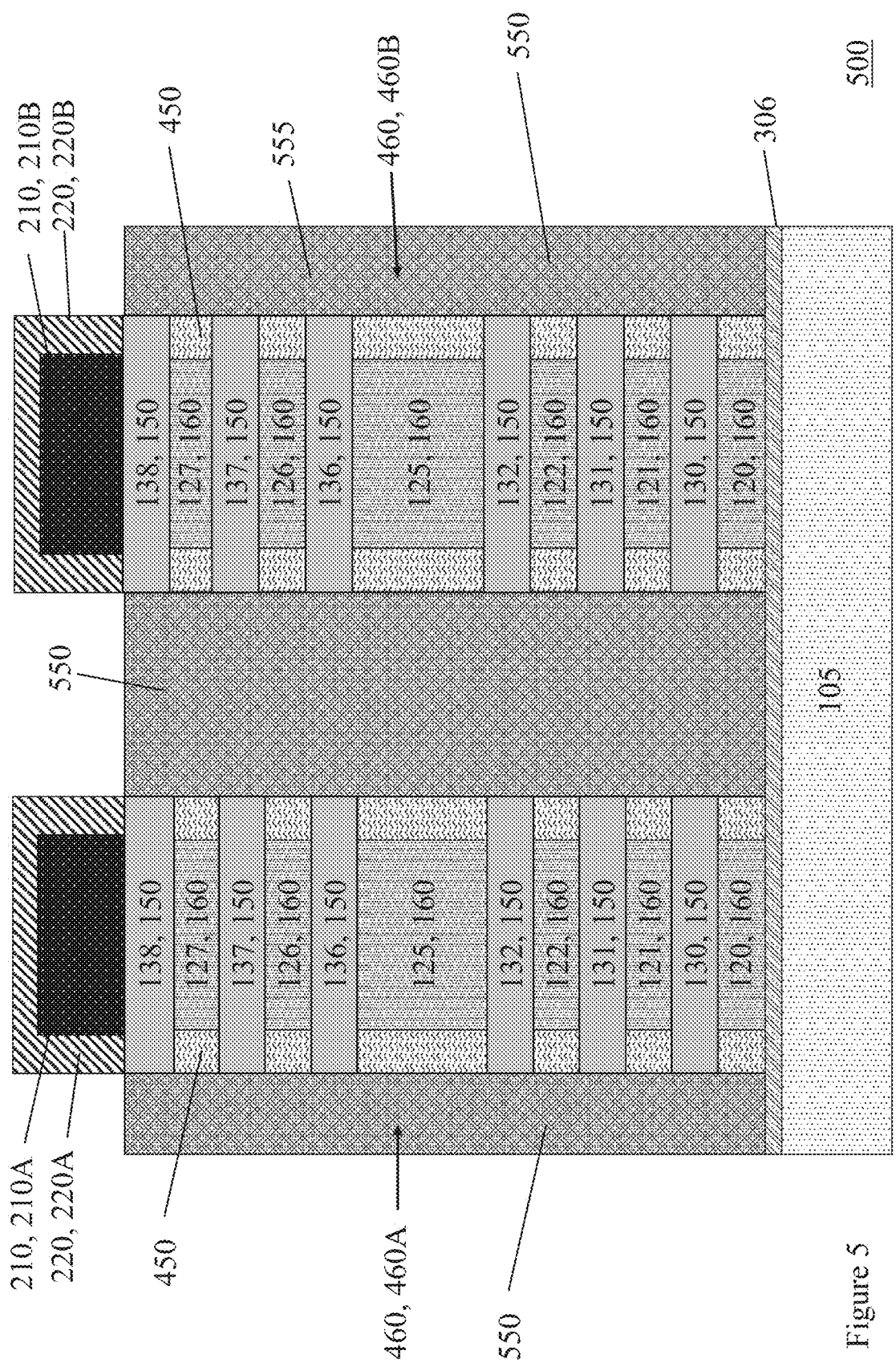
FIG. 5 is a cross-section view of an interim structure after epitaxial growth of a first source/drain (S/D) region(s) with a first doping type surrounding the spacer stack pair.

FIG. 5 is a cross-section view of an interim structure after epitaxial growth of a first source/drain (S/D) region(s) 550 with a first doping type 555 around the spacer stack pairs 460.

The first source/drain (S/D) region 550 is epitaxially grown with doping methods, as described above.

In some embodiments, the first S/D region 550 is doped 555 with a first dopant 555 of opposite type than the channel doping 155B of the channel layers (150, 130, 131, and 132) below the center dummy gate layer 125/160.

In some embodiments, the first S/D region 550 is doped with a first dopant 555 that is an p-type dopant with a first dopant 555 concentration between $4 \times 10^{20}$ cm$^{-3}$ and $5 \times 10^{21}$ cm$^{-3}$. In some embodiments, the first S/D region 550 is made of SiGe doped with boron (B) with a dopant concentration between $4 \times 10^{20}$ cm$^{-3}$ and $5 \times 10^{21}$ cm$^{-3}$. Other materials and dopants are envisioned.

Figure 6:
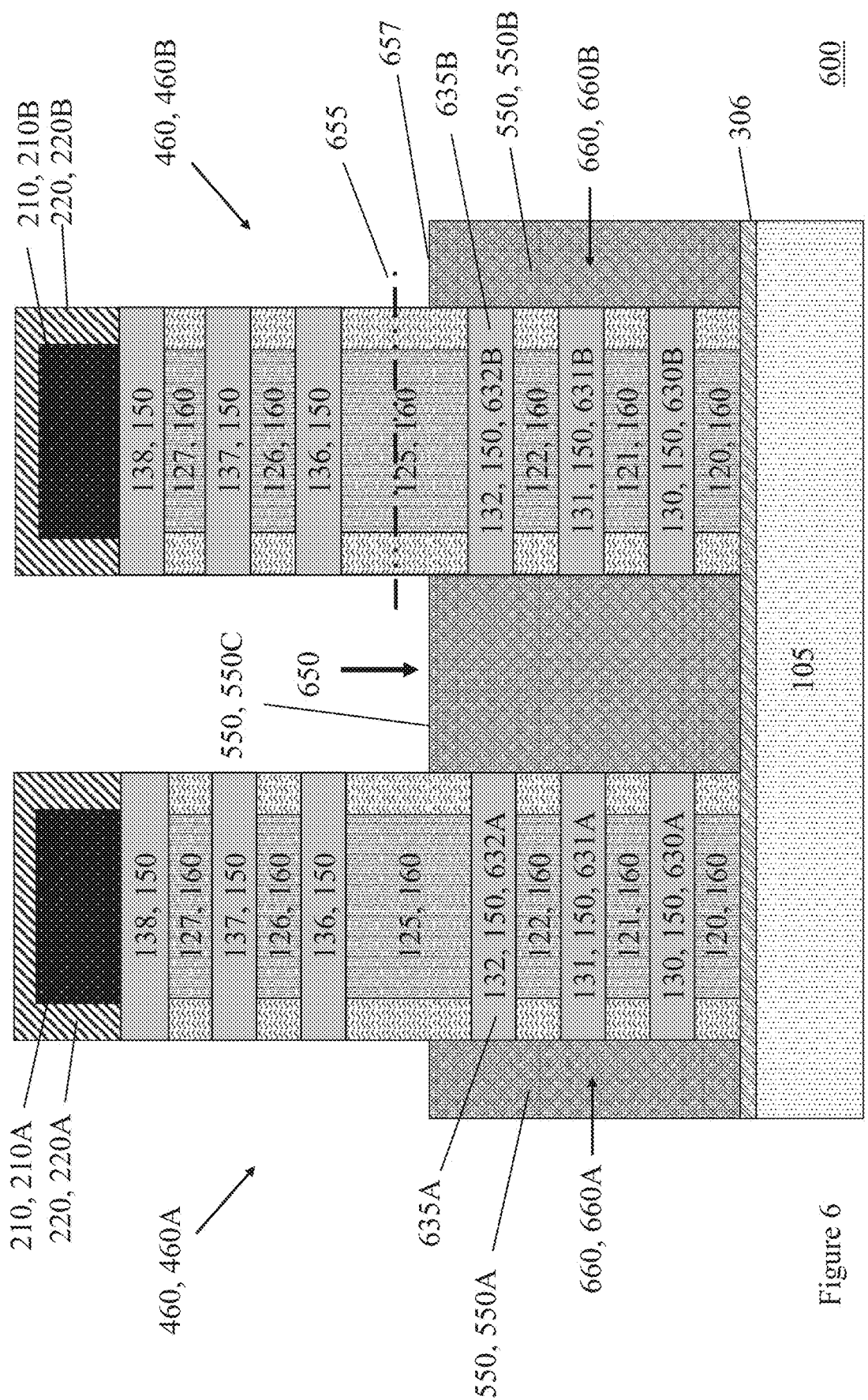
FIG. 6 is a cross-section view of an interim structure after a recess of the grown first S/D region.

FIG. 6 is a cross-section view of an interim structure 600 after a recess 650 of the grown first S/D region 550.

The first S/D region 550 is selectively etched using known techniques and etchants.

The etching chemistry selectively removes the first S/D 550 material, e.g. SiGe, while having little or no effect on the materials in the channel layers 150, gate spacers 220, or dummy gates 210. For example, the first S/D 550 etch 650 can be a suitable timed wet or dry etch including a timed exposure to known chemistries like a gaseous HCl or other available methods, e.g. developed by TEL, Tokyo Electron Ltd.

The top surface 657 of the first S/D 550 is etched down 650 until it lies approximately just below and near the center line 655 of the center dummy gate layer 125/160.

The first S/D 550 is in electrical and physical contact with the ends of all the channel layers (150, 130, 131, and 132) below the center dummy gate layer 125/160. As such, the field effect transistor (FET) of a first type comprises multiple channel layers stacked in parallel and is created below the center dummy gate layer 125/160 in each spacer stack pair 460.

In other words, a first FET 660 of a first type, e.g. a first left FET 660/660A, is created below the center dummy gate layer 125/160 in the left 460A spacer stack 460A in the spacer stack pair. A first FET 660 of a first type, e.g. a first right FET 660/660B is created below the center dummy gate layer 125/160 in the right 460B spacer stack 460B in the spacer stack pair.

Each of the first left FET 660A and the first right FET 660B has one or more channel layers. In the embodiment shown 600, the first left FET 660A has three first left FET channel layers 630A/631A/632A, typically 635A, and the first right FET has three first right FET channel layers 630B/631B/632B, typically 635B. The first left FET channel layers 635A are each connected between a first left FET S/D 550/550A and a first common FET S/D 550/550C, i.e. the first left FET channel layers 635A are connected in parallel between the first left FET S/D 550/550A and the first common FET S/D 550/550C. The first right FET channel layers 635B are each connected between a first right FET S/D 550/550B and the same first common FET S/D 550/550C, i.e. the first right FET channel layers 635B are connected in parallel between the first right FET S/D 550/550B and the first common FET S/D 550/550C.

Accordingly, the greater number of first left FET channel layers 635A in the first left FET 660A, the greater the current capacity through the device 660A. Similarly, the current capacity of the first right FET 660B increases with the number of first right FET channel layers 635B.

Note again that the first left FET 660A and the first right FET 660B have one of their S/Ds 550/550C connected in a first common connection 550C internal within the device.

In some embodiments, the first S/D region 550 is doped p-type as described above, so that the first left FET 660A and the first right FET 660B are PFETs.

Figure 7:
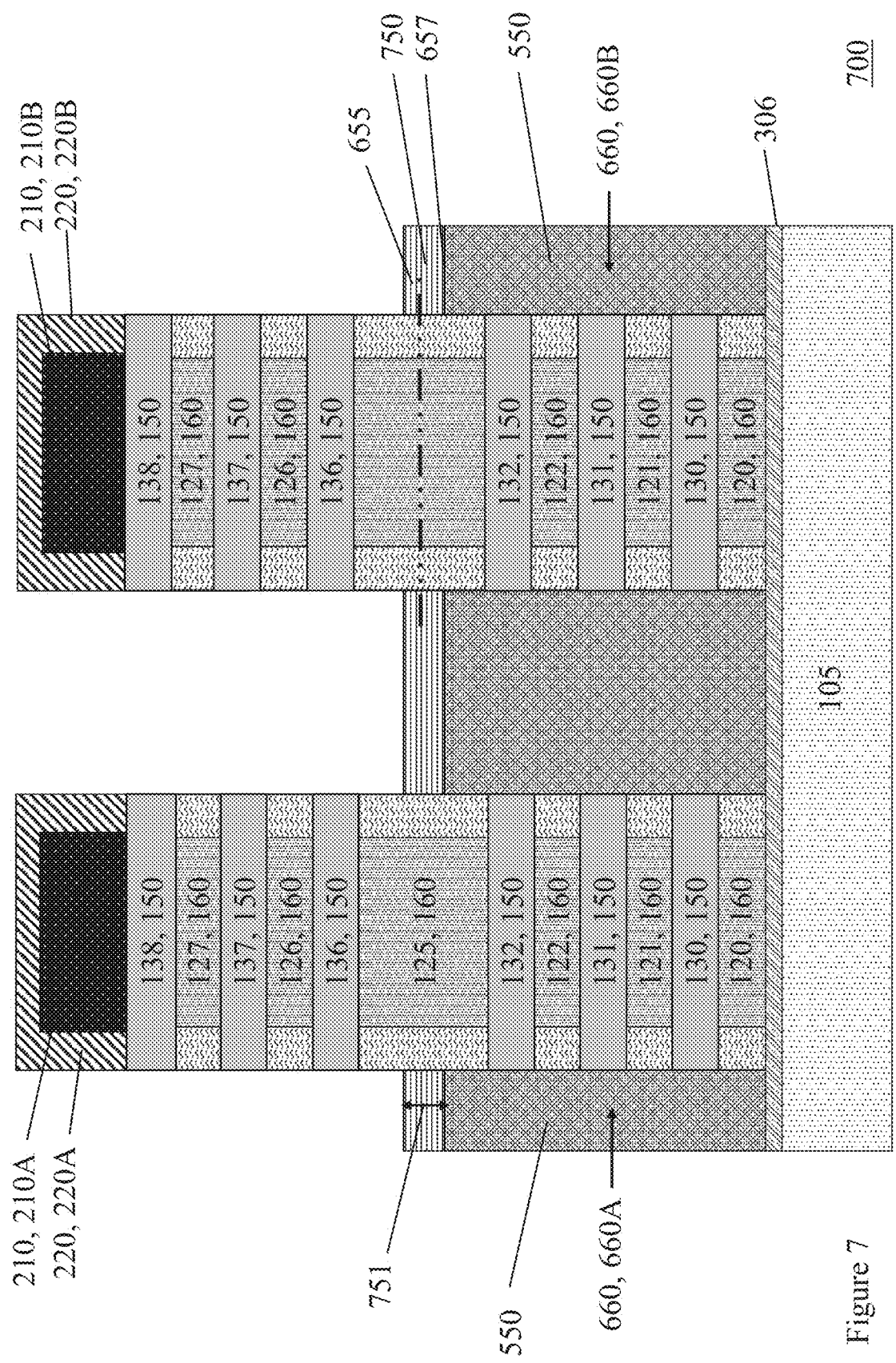
FIG. 7 is a cross-section view of an interim structure after deposition of an insulating layer, e.g. an oxide layer, and an optional recess.

FIG. 7 is a cross-section view of an interim structure 700 after deposition of an insulating layer, e.g. an oxide layer, 750 and an optional recess.

The insulating layer 750 electrical insulates the first left FET 660A and the first right FET 660B from layers that are formed later above the insulating layer 750.

The insulating layer 750 is made of an electrical insulator material that can be deposited on the surface 657 of the first S/D 550. In some embodiments, the insulating layer 750 is made from a flowable oxide, e.g. FOX disposed on the surface 657 by known techniques.

In some embodiments, the insulating layer 750 has a thickness 751 that is approximately centered about the center line 655 of the center dummy gate layer 125/160. In some embodiments, the insulating layer 750 thickness 751 is between 10 nm and 15 nm. An optional recess etch of the insulating layer 750 may be required to adjust the thickness of the insulating layer 750.

Figure 8:
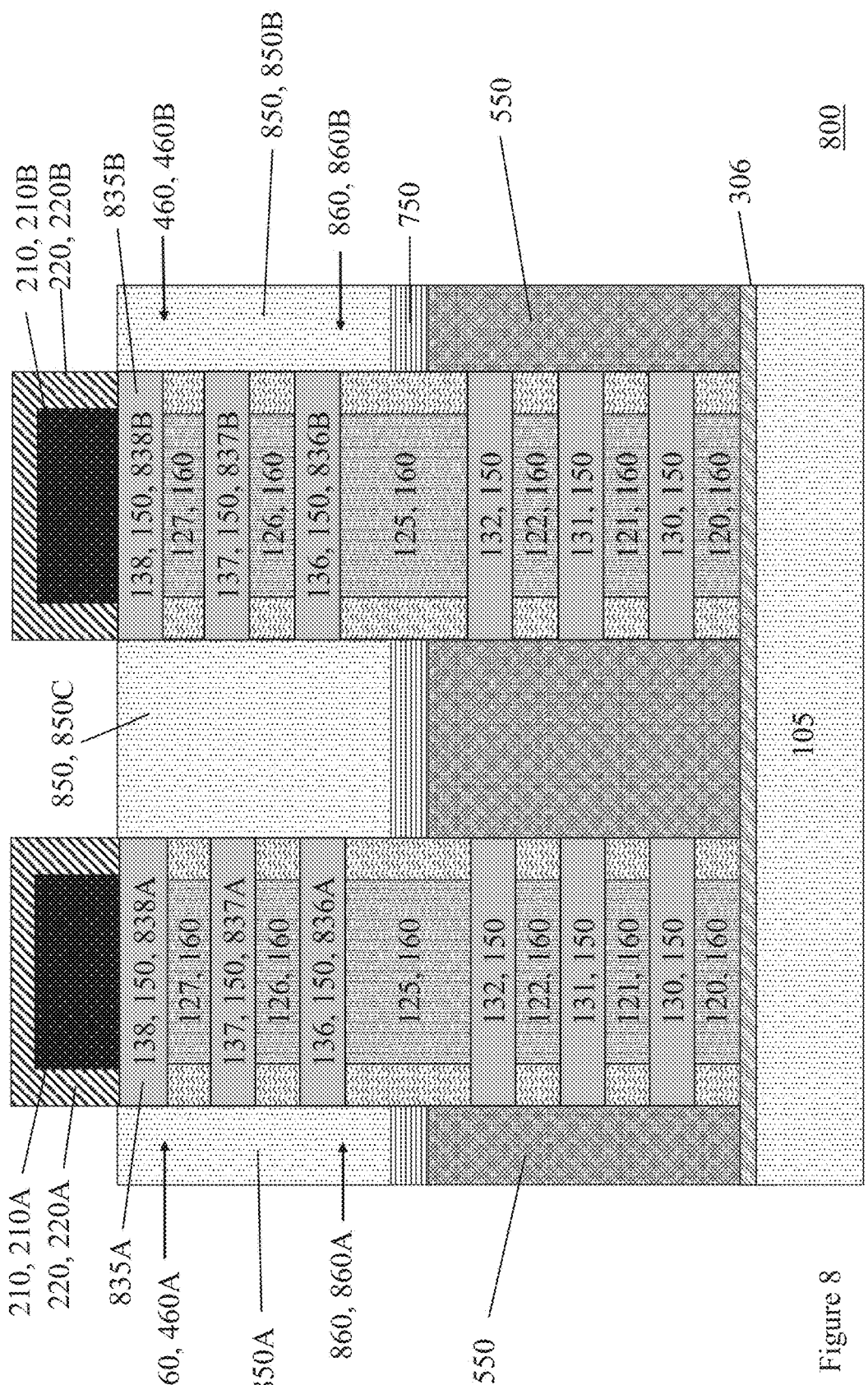
FIG. 8 is a cross-section view of an interim structure after epitaxial growth of a second source/drain (S/D) region(s) with a second doping type surrounding the spacer stack pair.

FIG. 8 is a cross-section view of an interim structure 800 after epitaxial growth of a second source/drain (S/D) region (s) 850 with a second doping type 855 around the left 460A and right 460B spacer stack in the spacer stack pair 460.

The second source/drain (S/D) region 850 is epitaxially grown with doping methods, as described above. In some embodiments, the second S/D region 850 begins growing at the sides of the channel layers 150 until it fills the volume between and around the spacer stack pair 460/450A/450B above the insulating layer 750. The second S/D region 850 continues to fill the volume above the insulating layer 750 until the gate spacer 220 is reached.

In some embodiments, the second S/D region 850 is doped 855 with a second dopant 855 of opposite type than the channel doping 155A (if doped) of the channel layers (150, 136, 137, and 138) above the center dummy gate layer 125/160.

In some embodiments, the second S/D region 850 is doped with a second dopant 855 that is an n-type dopant with a second dopant 855 concentration between $4 \times 10^{20}$ $cm^{-3}$ and $5 \times 10^{21}$ $cm^{-3}$. In some embodiments, the second S/D region 850 is made of silicon (Si) doped with phosphorous (P) with a dopant concentration between $1 \times 10^{20}$ $cm^{-3}$ and $5 \times 10^{21}$ $cm^{-3}$. Other materials and dopants are envisioned.

The second S/D 850 is in electrical, and physical contact with the ends of all the channel layers (150, 136, 137, and 138) above the center dummy gate layer 125/160. As such, a field effect transistor (FET) of a second type with multiple channel layers is created above the center dummy gate layer 125/160 in each spacer stack pair 460.

In other words, a second FET 860 of a second type, e.g. a second left FET 860/860A, is created above the center dummy gate layer 125/160 in the left 460A spacer stack 460A of the spacer stack pair 460. A second FET 860 of a second type, e.g. a second right FET 860/860B, is created above the center dummy gate layer 125/160 in the right 460B spacer stack 460B of the spacer stack pair 460.

Each of the second left FET 860A and the second right FET 860B has one or more channel layers 835A/835B, respectively. In the embodiment shown 800, the second left FET 860A precursor has three second left FET channel layers 836A/837A/838A, typically 835A, and the second right FET has three second right FET channel layers 836B/837B/838B, typically 835B. The second left FET channel layers 835A are each connected between a second left FET S/D 850/850A and a second common FET S/D 850/850C, i.e. the second left FET channel layers 835A are connected in parallel between the second left FET S/D 850/850A and the second common FET S/D 850/850C. The second right FET channel layers 835B are each connected between a second right FET S/D 850/850B and the same second common FET S/D 850/850C, i.e. the second right FET channel layers 835B are connected in parallel between the second right FET S/D 850/850B and the second common FET S/D 850/850C.

Accordingly, the greater the number of second left FET channel layers 835A in the second left FET 860A, the greater the current capacity through the device 860A. Similarly, the current capacity of the second right FET 860B increases with the number of second right FET channel layers 835B.

Note again that the second left FET 860A and the second right FET 860B have one of their S/Ds 850/850C connected in (to a second) common 850C, internal to the device.

In some embodiments, the second S/D region 850 is doped n-type as described above, so that the second left FET 860A and the second right FET 860B are NFETs.

Figure 9:
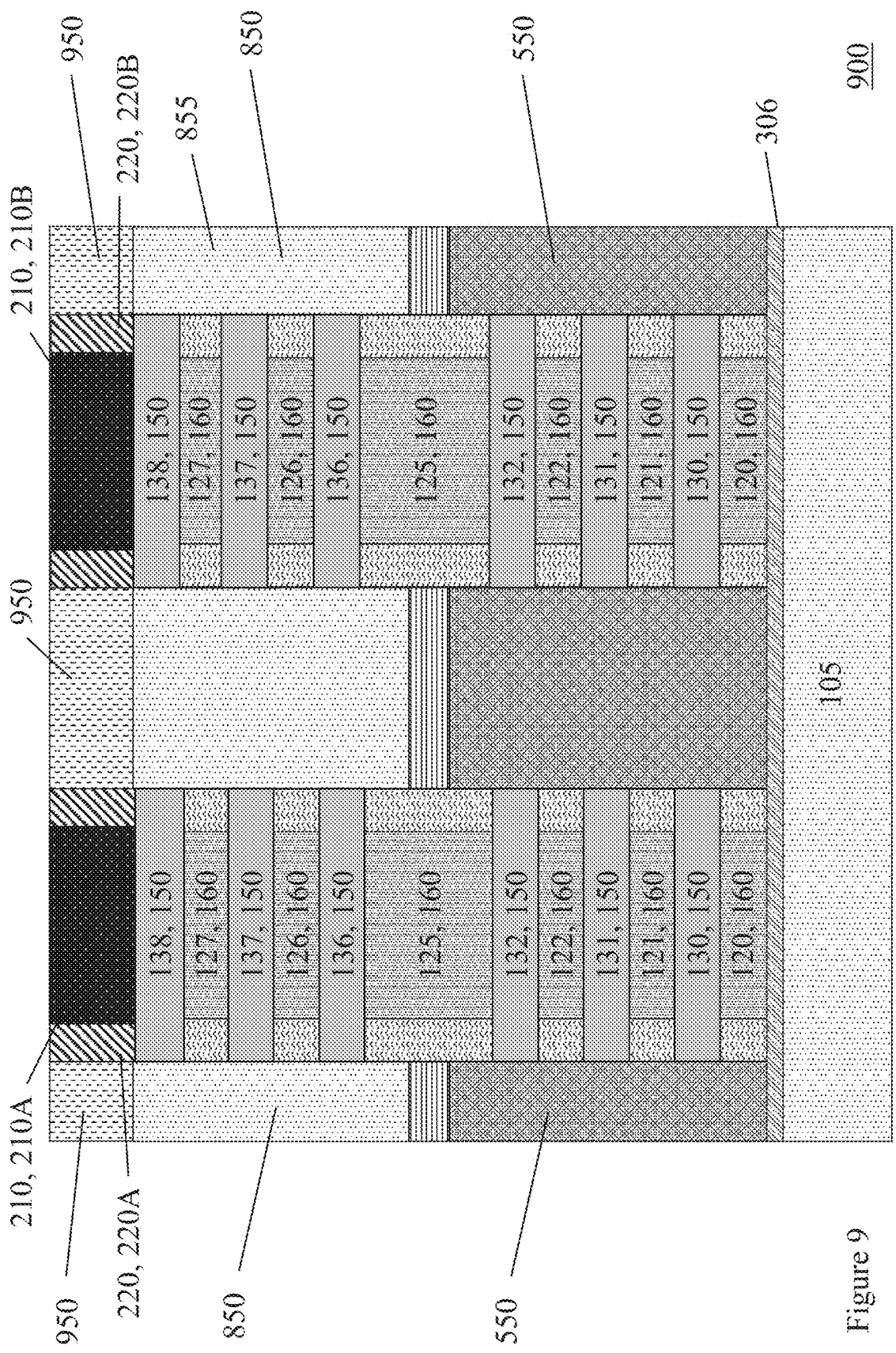
FIG. 9 is a cross-section view of an interim structure after top voids are filled with an interlayer dielectric (ILD).

FIG. 9 is a cross-section view of an interim structure 900 after top voids are filled with an interlayer dielectric (ILD) 950.

The ILD fill 950 may be formed from a low-k dielectric material (with k<4.0), including but not limited to, silicon oxide, spin-on-glass, a flowable oxide, a high-density plasma oxide, borophosphosilicate glass (BPSG), or any combination thereof. The ILD 950 can be deposited by deposition processes, including, but not limited to CVD, PVD, PECVD, ALD, evaporation, chemical solution deposition, or like processes.

In some embodiments, the structure 900 is planarized by known methods like CMP. In some embodiments, in addition to smoothing the top surface of the structure 900, the CMP removes the top part of the gate spacer 220 and exposes the dummy gate 210 material.

Figure 10:
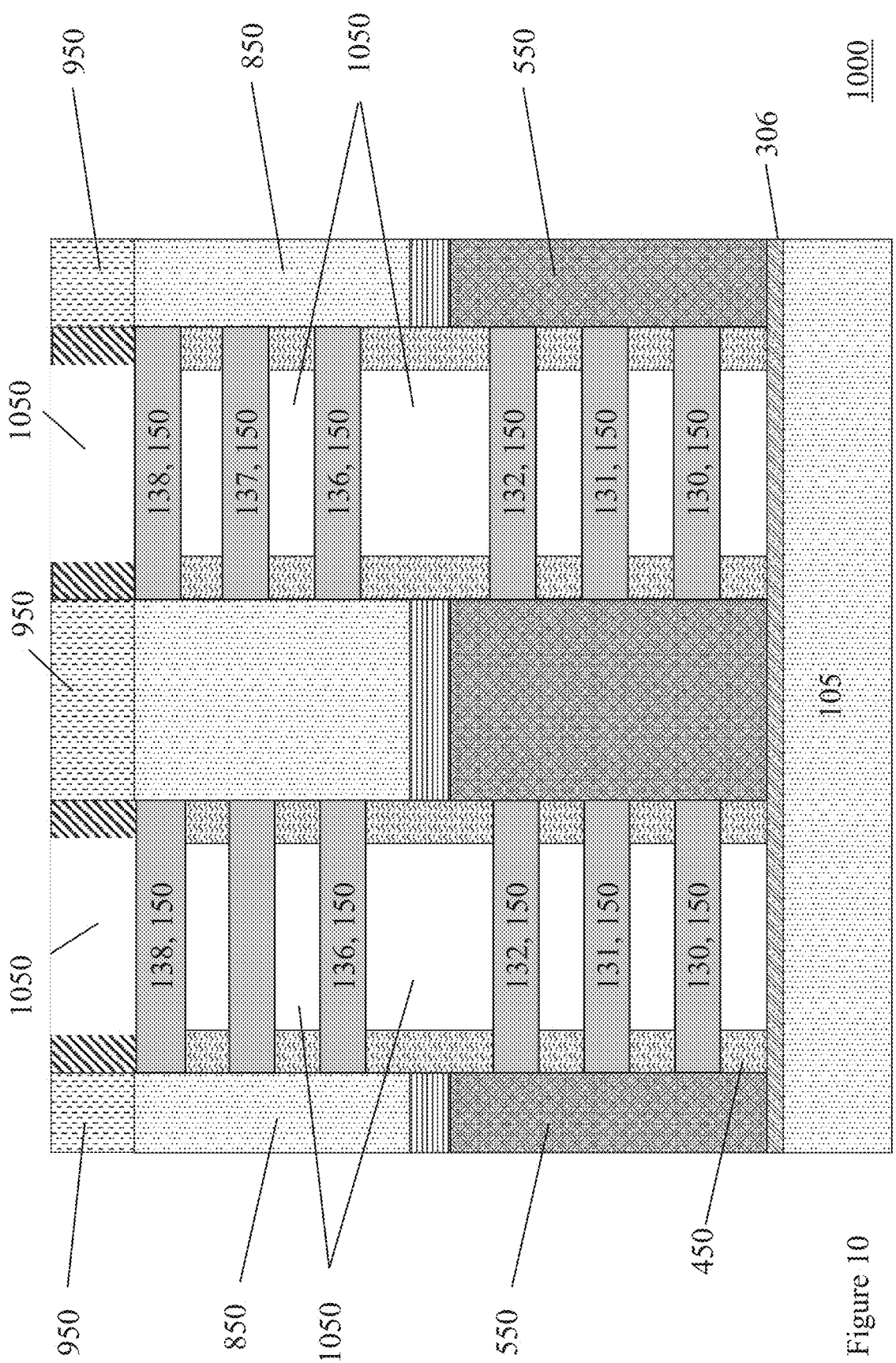
FIG. 10 is a cross-section view of an interim structure after removing the dummy gates and a channel release.

FIG. 10 is a cross-section view of an interim structure 1000 after dummy gates 160/210 are removed and the channels, typically 150, are released, prior to formation of one or more gate stacks.

The dummy gate 210 and the all-around dummy gate 160 materials are removed by a release etch. In cases where the dummy gate 210 and the all-around dummy gate layers 160 are made of the same material, e.g. SiGe, only one release etch is required. In cases there the dummy gate 210 and the all-around dummy gates 160 are made of different materials, multiple release etches might be needed.

In some embodiments, the dummy gate 210 and the all-around dummy gates 160 are made of SiGe. In these embodiments, the SiGe in the dummy gate 210 and all-around dummy gate 160 material (e.g., SiGe) around the channels 150 can be selectively removed by a dry etch, or exposure to ammonium hydroxide (NH$_4$OH) at higher than room temperature, or exposure to a solution of hydrofluoric acid (HF).

The etching materials can access the dummy gate 210 from the top of the structure 1000. The etching materials can access the materials in the all-around dummy gate 160 from the exposed sides on the front and back (not shown) of the structure 1000.

The release etch leaves voids, typically 1050, between the inner spacers 450 and around the channels 150, where the dummy gate 210 and all-around dummy gate 160 material is removed to form the voided dummy gate layers, typically 1050. Gate stacks, described below, are formed in the voided regions 1050.

Figure 11:
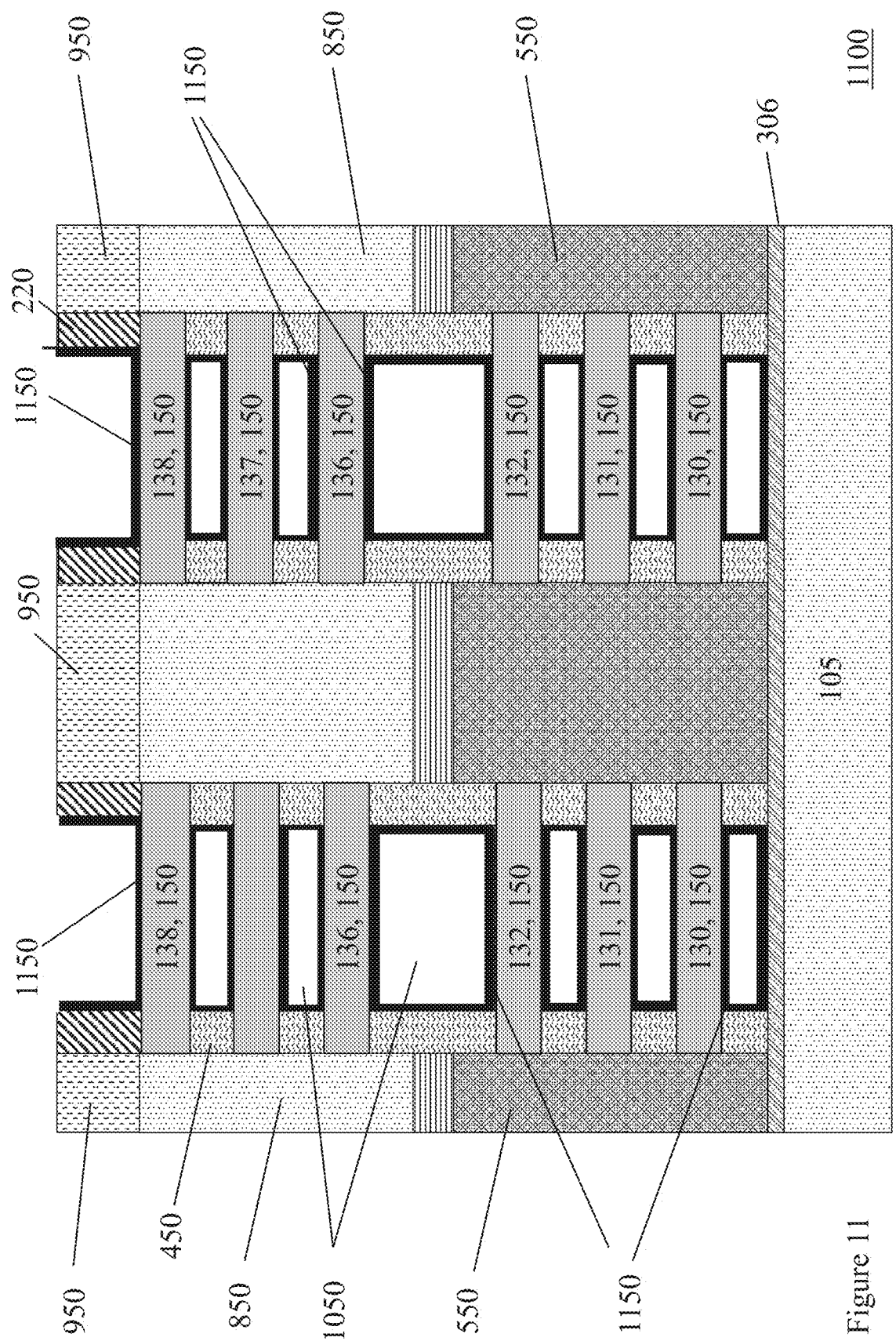
FIG. 11 is a cross-section view of an interim structure after deposition of a high-k dielectric material forming part of a gate stack for each of the spacer stacks in the spacer stack pair.

FIG. 11 is a cross-section view of an interim structure 1100 after deposition of a high-k material 1150 or gate dielectric layer 1150 that forms part of a gate stack.

The high-k material 1150 interfaces and encompasses the surface of the channels 150 (and surfaces of the inner spacers 450/gate spacers 220) and surrounds the voids 1050. The gate dielectric layer 1150 can be made of a dielectric material having a dielectric constant greater than 3.9, more preferably above 7.0, and still more preferably above 10.0. Non-limiting examples of suitable materials for the gate dielectric layer material 1150 include oxides, nitrides, oxynitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum.

The gate dielectric layer 1150 may be formed by suitable deposition processes, for example, CVD, PECVD, ALD, PVD, evaporation, chemical solution deposition, or other like processes. The thickness of the gate dielectric material 1150 may vary depending on the deposition process as well as the composition and number of high-k dielectric materials used but can be between 1 nm and 5 nm.

Figure 12:
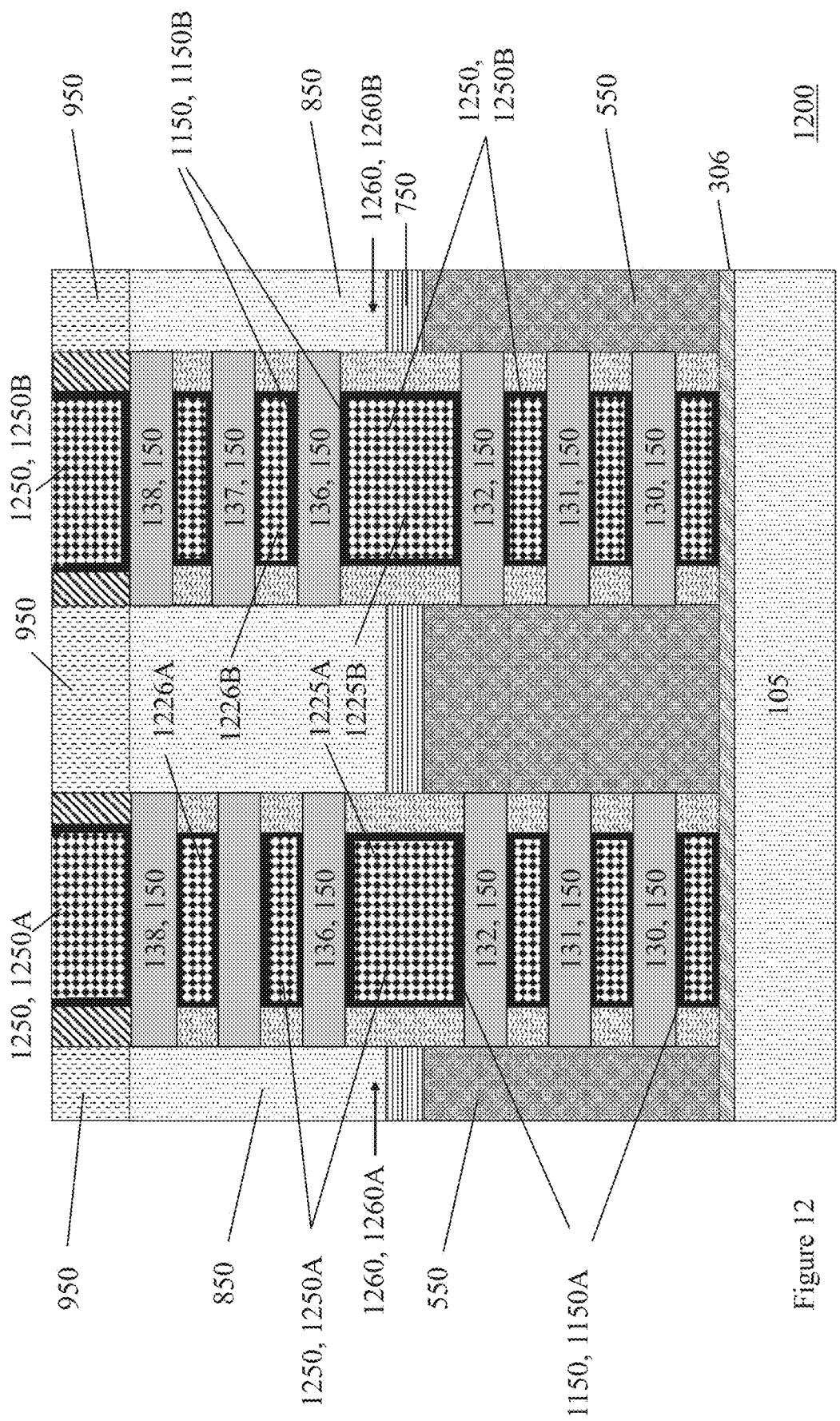
FIG. 12 is a cross-section view of an interim structure after deposition of a gate metal fill that completes formation of the gate stack for each of the spacer stacks in the spacer stack pair.

FIG. 12 is a cross-section view of an interim structure 1200 after deposition of a gate metal fill/layer, typically 1250, that completes formation of the gate stacks 1150/1250.

The gate metal layers 1250 fill the voids 1050 within the gate dielectric layers 1150 and surround the channels 150.

In some embodiments, a left gate stack 1150A/1250A is formed around the first left FET channel layers 635A and the second left FET channel layers 835A. A right gate stack 1150B/1250B is formed around the first right FET channel layers 635B and the second right FET channel layers 835B.

The gate metal layers 1250 are made from conductive (metallic) materials including but are not necessarily limited to: titanium nitride (TiN), tantalum nitride (TaN) or ruthenium (Ru), titanium aluminum nitride (TiAlN), titanium aluminum carbon nitride (TiAlCN), titanium carbide (TiC), titanium aluminum carbide (TiAlC), tantalum aluminum carbide (TaAlC), tantalum aluminum carbon nitride (TaAlCN) or lanthanum (La) doped TiN, TaN. These gate metals 1250 are deposited using, for example, deposition techniques including, but not limited to, CVD, PECVD, PVD, ALD, LSMCD, Radio Frequency Chemical Vapor Deposition (RFCVD), Pulsed Laser Deposition (PLD), Liquid Source Misted Chemical Deposition (LSMCD), and/or sputtering.

Once the gate stacks 1150/1250 are formed, two FET stacks 1260, typically 1260 are formed. A left FET stack 1260A has the first left FET 660A of the first type below the insulating layer 750 with the second left FET 860A of the second, opposite type stacked above the insulating layer 750 and above the first left FET 660A. A right FET stack 1260B has the first right FET 660B of the first type below the insulating layer 750 with the second right FET 860B of a second, opposite type stacked above the insulating layer 750 and above the first right FET 660B.

In some embodiments, the left FET stack 1260A has a single left gate stack 1150A/1250A that surrounds and encompasses all the channels 150 (635A, 835A) in the left FET stack 1260A. In like fashion, the right FET stack 1260B has a single right gate stack 1150B/1250B that surrounds and encompasses all the channels 150 (635B, 835B) in the right FET stack 1260B. Accordingly, a voltage applied to the left gate stack 1150A/1250A controls all channels 150/635A/835A in the single left FET stack 1260A simultaneously and a voltage applied to the right gate stack 1150B/1250B independently controls all channels 150/635B/835B in the right FET stack 1260B simultaneously. Since in this configuration an FET can have more than one channel 150 connected in parallel, a single gate stack 1150/1250 controlling all the channels 150 in the FET increases the drive current of the FET.

The left gate stack 1150A/1250A has a left center gate stack 1225A, formed in the void 1150 left in the center dummy gate layer 125 of the left FET stack 1260A, and one or more left gate stack layers, typically 1226A, formed in the voids 1150 left in the dummy gate stack layers 160 (above and below the center dummy gate layer 125) in the left FET stack 1260A. In some embodiments, the left center gate stack 1225A is thicker than the left gate stack layers 1226A and the insulating layer 750 is approximately centered on and surrounds the middle of the left center gate stack 1225A.

The right gate stack 1150B/1250B has a right center gate stack 1225B, formed in the void 1150 left in the center dummy gate layer 125 of the right FET stack 1260B, and one or more right gate stack layers, typically 1226B, formed in the voids 1150 left in the dummy gate stack layers 160 (above and below the center dummy gate layer 125) in the right FET stack 1260B. In some embodiments, the right center gate stack 1225B is thicker than the right gate stack layers 1226B and the insulating layer 750 is approximately centered on and surrounds the middle of the right center gate stack 1225B.

In some embodiments, the left center gate stack 1150A/1250A and the right center gate stack 1150B/1250B have a gate stack thickness 162 equal to the thickness 162 of the center dummy gate layer 125 thickness 162, e.g. between of about 10 nm to about 100 nm, or 20 nm to 50 nm. Other thicknesses are possible.

Figure 13:
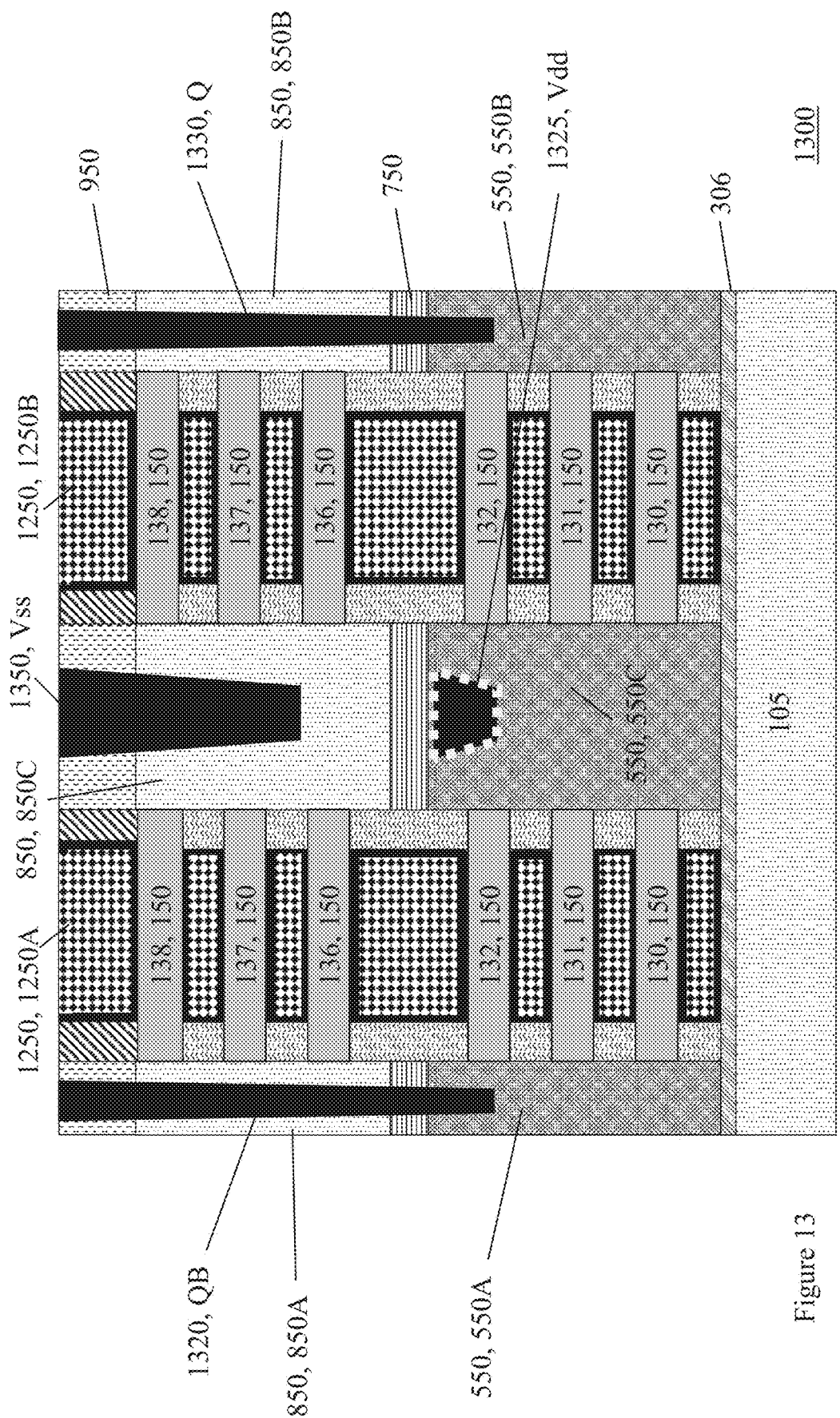
FIG. 13 is a cross-section view of one embodiment of a cross-coupled inverter structure after external contact formation.

FIG. 13 is a cross-section view of one embodiment of an inverter structure 1300 after external contact formation.

In some embodiments, external electrical contacts (1320, 1330, 1325, and 1350) are made to S/D regions of the device 1300 by opening one or more trenches through various S/D regions, the insulating layer 750, and/or the ILD 950 as explained below. In some embodiments, the openings are made using lithographic or laser techniques to expose the regions where contact is made to a conductive contact material.

Contact 1325, a first external power contact 1325, which is a positive voltage supply, Vdd, contact 1325 in this embodiment, is shown in phantom view because it penetrates in a region of the device 1300 in front of (or in back of) a second external power contact 1350, which is a negative voltage supply, Vss, 1350 in this embodiment, or alternatively, an external ground contact 1350. Contact 1325, Vdd, is in direct electrical contact with the first common FET S/D 550/550C but it is electrically insulated from the second common FET S/D 850/850C by the insulating layer 750.

A trench is made through the IDL 950 and into the second common FET S/D 850/850C. This trench is filled with a conductive material that forms the external contact 1350, Vss, with the second common FET S/D 850/850C connection.

A trench is made through the IDL 950, the second left FET S/D 850/850A, the insulating layer 750, and into the first left FET S/D 550/550A. This trench is filled with a conductive material that fills the trench and forms the external contact 1320, QB, that connects together and connects to the second left FET S/D 850/850A and the first left FET S/D 550/550A.

A trench is made through the IDL 950, the second right FET S/D 850/850B, the insulating layer 750, and into the first right FET S/D 550/550B. This trench is filled with a conductive material that fills the trench and forms the external contact 1320, Q, that connects together and connects to the second right FET S/D 850/850B and first right FET S/D 550/550B.

An external electrical contact (not shown) can be made to the gate metal 1250 by connecting to the exposed gate metal 1250/1250A for the left FET stack 1260/1260A and/or to the exposed gate metal 1250/1250B for the right FET stack 1260/1260B, respectively.

Non-limiting examples of conductive material include a conductive metal like aluminum (Al), platinum (Pt), gold (Au), tungsten (W), titanium (Ti), Cobalt (Co) or any combination thereof. The conductive material may be deposited by a suitable deposition process, for example, CVD, PECVD, PVD, plating, thermal or e-beam evaporation, or sputtering.

In some embodiments, when connecting a metal to a semiconductor material, a silicide layer is formed on exposed surfaces of semiconductor material. Then the conductive material (metal) is deposited to make the contact. A typical known silicide formation process includes depositing a metal (like Ni) on a semiconductor surface, followed by an annealing, e.g. between 410 and 425 degrees Celsius for about 15 minutes, and then removing the unreacted metal.

Figure 14:
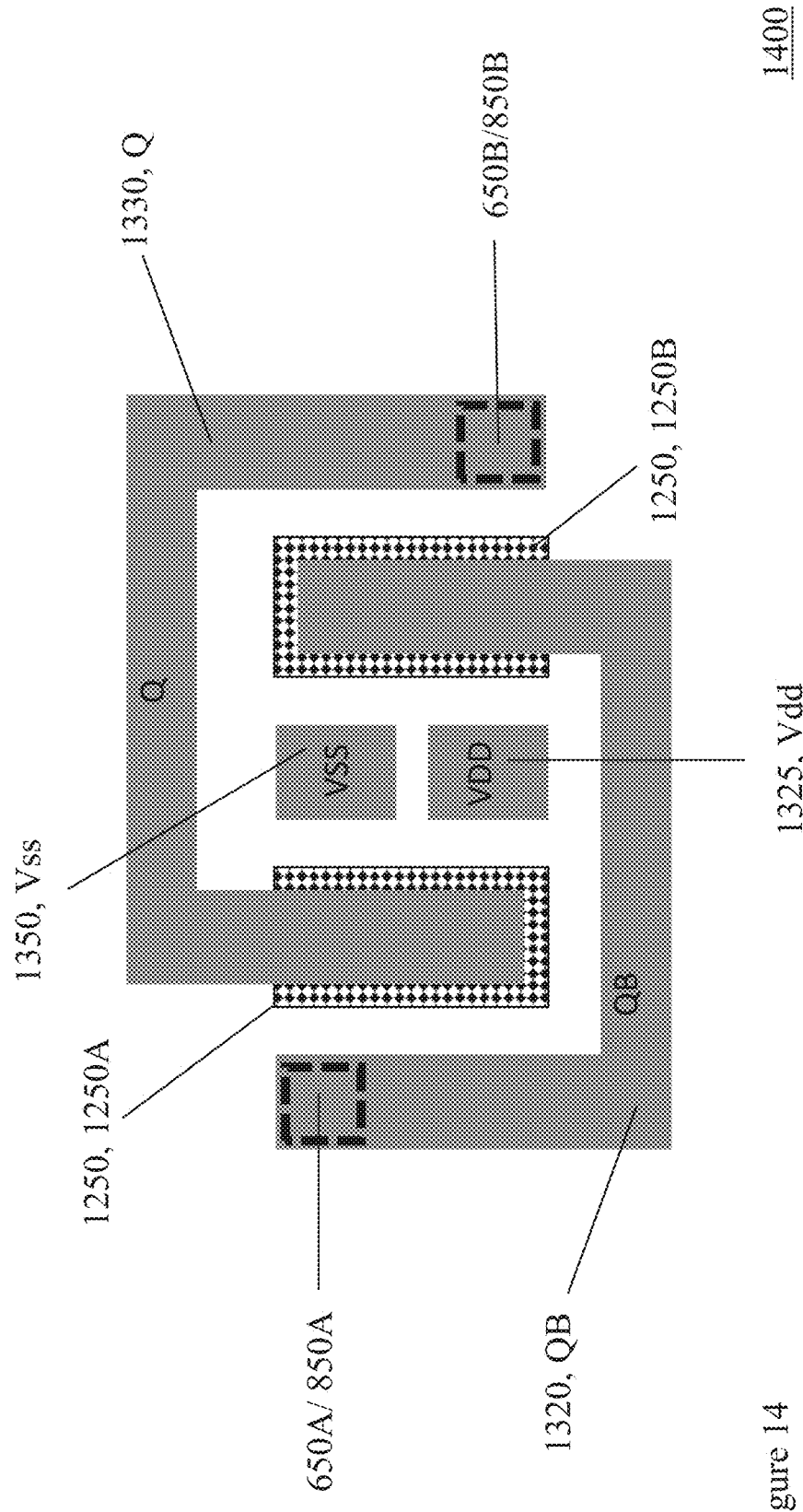
FIG. 14 is a top-down view of one embodiment of a cross-coupled inverter structure.

FIG. 14 is a top-down view 1400 of one embodiment of a cross-coupled inverter structure 1300.

Connection 1320, QB, connects the connected first left FET S/D 550A and second left FET S/D 850A to the exposed gate metal 1250/1250B for the right FET stack 1260/1260B. Connection 1330, Q, connects the connected first right FET S/D 550B and second right FET S/D 850B to the exposed gate metal 1250/1250A for the left FET stack 1260/1260A. External voltage terminals Vss and Vdd are connected to external connections 1350 and 1325, respectively. With this inverter structure 1300 only 4 external connections (1320, 1325, 1330, and 1350) are required since many of the connections required to connect the components of the inverter 1300 are made internal to the device 1300. Accordingly, device 1300 external connection is simplified and device chip area is reduced.

Figure 15:
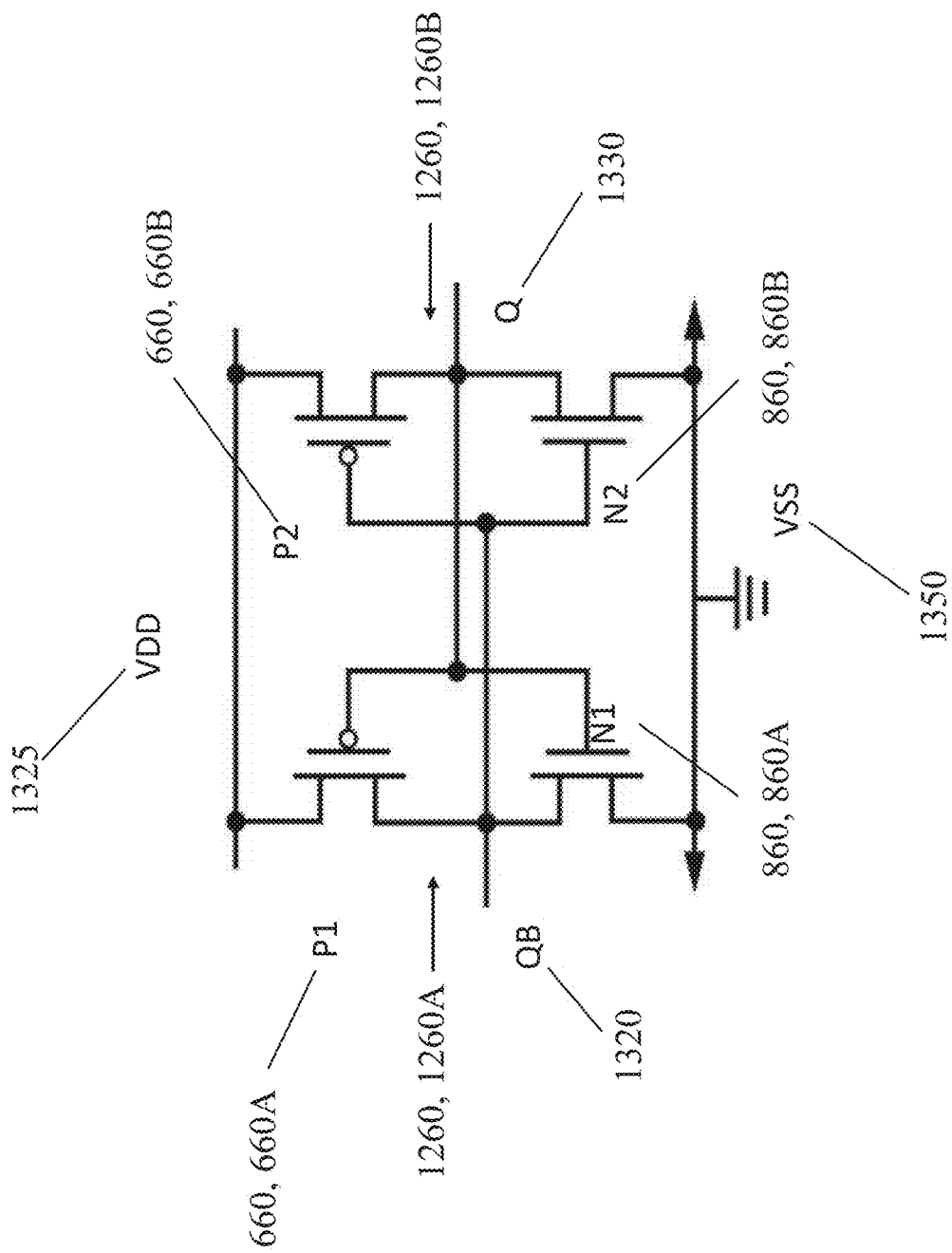
FIG. 15 is an example circuit schematic of a cross-coupled inverter structure.

FIG. 15 is an example circuit schematic 1500 of a cross-coupled inverter structure 1300. In this embodiment, two FET stacks 1260 are shown. The left FET stack 1260A has the first left FET 660A as a first type (here a p-channel or PFET, P1) stacked with the second left FET 860/860A of the second, opposite type (here an n-channel or NFET, N1). Similarly, the right FET stack 1260/1260B has the first right FET 660/660B of the first type (again a p-channel or PFET, P2) stacked with the second right FET 860B of a second, opposite type (again an n-channel or NFET, N2).

Connection 1320, QB, and connection 1330, Q, are shown, as are power connections Vdd 1325 and Vss 1350. The cross-coupled inverter 1300/1500 typically produces an output QB 1320 that is logically opposite of output Q 1330 during an operation phase of interest, as known in the art. For instance, in a memory cell, a logical "0" is stored in Q while a logical "1" is stored in QB, and vice versa.

Figure 16:
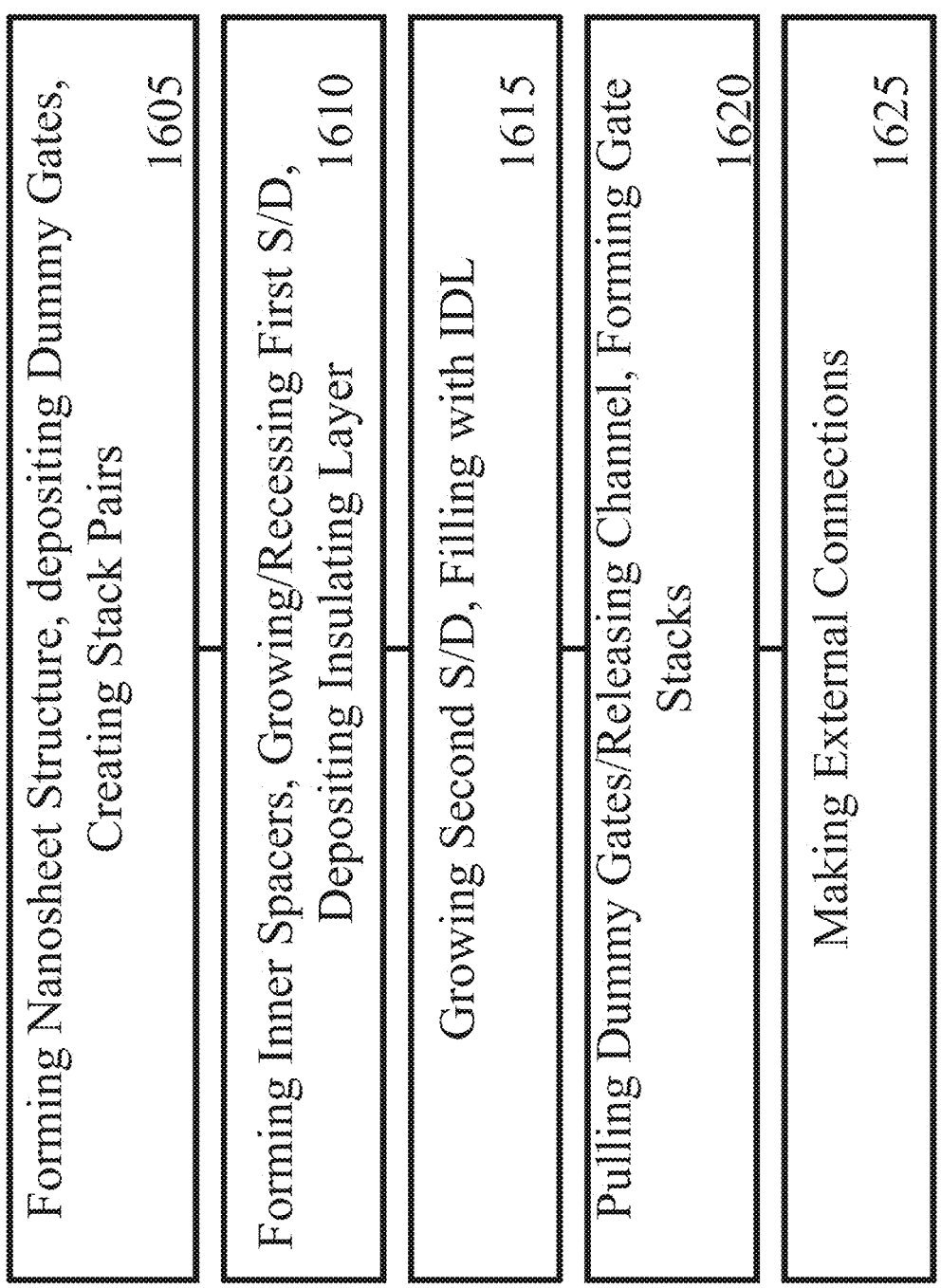
FIG. 16 is a flow chart of a method of making a cross-coupled inverter from nanosheet structure.

FIG. 16 is a flow chart of a method of making 1600 an inverter 1300 from nanosheet structure 100.

The method begins with step 1605 by forming the alternate nanolayers 150/160, depositing the pairs (210A, 210B) of dummy gates 210 and the pairs (220A, 220B) of gate spacers 220, and removing material (310, 315, and 320) to create the stack pairs 360.

In step 1610, the inner spacers 450 are formed on the exposed ends 455 of what remains of the dummy gate layers 160. The first source/drain (S/D) 550 is epitaxially grown and recessed 650. The insulating layer 750 is deposited.

In step 1615 the second source/drain 850 is grown and the IDL layer fills the voids in the top of the structure 900.

In step 1620 the gate stacks 1150/1250 are formed, as described above. The dummy gate material 160/210 is removed, voids 1050 are created around the channels 150. The high-k gate dielectric layer 1150 and gate metal layers 1250 are deposited.

In step 1625 the external connections (1320, 1325, 1330, and 1350) are made for the cross-coupled inverter 1300.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. For example, the semiconductor devices, structures, and methods disclosed in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, expert and artificial intelligence systems, functional circuitry, etc. Systems and hardware incorporating the semiconductor devices are contemplated embodiments of the invention.

The terminology used herein was chosen to explain the principles of the embodiments and the practical application or technical improvement over technologies found in the marketplace or to otherwise enable others of ordinary skill in the art to understand the embodiments disclosed herein. Devices, components, elements, features, apparatus, systems, structures, techniques, and methods described with different terminology that perform substantially the same function, work in the substantial the same way, have substantially the same use, and/or perform the similar steps are contemplated as embodiments of this invention.

We claim:

1. A cross-coupled inverter comprising:
   a left field effect transistor (FET) stack comprising:
      a first left FET with a first type, the first left FET having one or more first left FET channel layers connected in parallel between a first left FET source drain (S/D) and a first common S/D;
      an insulating layer disposed on the first left FET S/D and the first common S/D;
      a second left FET with a second type, the second type opposite the first type, the second left FET having one or more second left FET channel layers connected in parallel between a second left FET S/D) and a second common S/D, the first left FET S/D and the second left FET S/D internally and electrically connected together and connected to a QB external connection; and
      a left gate stack surrounding the one or more first left FET channel layers and the one or more second left FET channel layers;
   a right field effect transistor (FET) stack comprising:
      a first right FET with the first type, the first right FET having one or more first right FET channel layers connected in parallel between a first right FET S/D and the first common S/D, the insulating layer also disposed on the first right FET S/D;
      a second right FET with the second type, the second right FET having one or more second right FET channel layers connected in parallel between a second right FET S/D and the second common S/D, the first right FET S/D and the second right FET S/D internally and electrically connected together and connected to a Q external connection; and
      a right gate stack surrounding the one or more first right FET channel layers and the one or more second right FET channel layers,
   wherein the Q external connection is externally connected to the left gate stack and the QB external connection is externally connected to the right gate stack.

2. The cross-coupled inverter, as in claim 1, where the first common S/D is connected to a first external power contact and the second common S/D is connected to a second external power contact.

3. The cross-coupled inverter, as in claim 1, where during a desired operation phase, the Q external connection has a logically opposite value than the QB external connection.

4. The cross-coupled inverter, as in claim 1, where the first left FET and the first right FET are PFETs.

5. The cross-coupled inverter, as in claim 4, where the first left FET S/D, the first common S/D, and the first right FET S/D are made of silicon-germanium (SiGe).

6. The cross-coupled inverter, as in claim 4, where the first left FET S/D, the first common S/D, and the first right FET S/D are doped with one of the following: boron (B), gallium (Ga), indium (In), and thallium (Tl).

7. The cross-coupled inverter, as in claim 1, where the second left FET and the second right FET are NFETs.

8. The cross-coupled inverter, as in claim 7, where the second left FET S/D, the second common S/D, and the second right S/D are made of silicon (Si).

9. The cross-coupled inverter, as in claim 7, where the second left FET source drain (S/D), the second common S/D, and the second right FET S/D are doped with one of the following: phosphorus (P), arsenic (As) and antimony (Sb).

10. A cross-coupled inverter comprising:
    a left field effect transistor (FET) stack comprising:
       a first left FET with a first type, the first left FET having one or more first left FET channel layers connected in parallel between a first left FET source drain (S/D) and a first common S/D;
       an insulating layer disposed on the first left FET S/D and the first common S/D;
       a second left FET with a second type, the second type opposite the first type, the second left FET having one or more second left FET channel layers connected in parallel between a second left FET S/D and a second common S/D, the first left FET SID and the second left FET S/D internally and electrically connected together and connected to a QB external connection, the second left FET disposed on the insulating layer and stacked above the first left FET; and
       a left gate stack surrounding the one or more first left FET channel layers and the one or more second left FET channel layers, the left gate stack having a left center gate stack and one or more left gate stack layers, the left center gate stack being thicker than the left gate stack layers and the insulating layer surrounding a middle of the left center gate stack;
    a right field effect transistor (FET) stack comprising:
       a first right FET with the first type, the first right FET having one or more first right FET channel layers connected in parallel between a first right FET S/D and the first Common S/D, the insulating layer also disposed on the first right FET;
       a second right FET with the second type, the second right FET having one or more second right FET channel layers connected in parallel between a second right FET S/D and the second common S/D, and the first right FET S/D and the second right FET S/D internally and electrically connected together and connected to a Q external connection; and a right gate stack surrounding the one or more of the first right FET channel layers and the one or more of the second right FET channel layers, the right gate stack having a right center gate stack and one or more right gate stack layers, the right center gate stack being thicker than the right gate stack layers and the insulating layer surrounding a middle of the right center gate stack layer, wherein the Q external connection is externally connected to the left gate stack and the QB external connection is externally connected to the right gate stack.

11. The cross-coupled inverter, as in claim 10, where the left gate stack and the right gate stack each have a gate dielectric layer made of one or more of the following materials: an oxide, a nitride, an oxynitride, a high-k material, hafnium oxide, hafnium silicon oxide; hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate.

12. The cross-coupled inverter, as in claim 10, where the left gate stack and the right gate stack each have a gate metal layer made from one or more of the same following materials: a conductive material, a metal, titanium nitride (TiN), tantalum nitride (TaN), ruthenium (Ru), titanium aluminum nitride (TiAlN), titanium aluminum carbon nitride (TiAlCN), titanium carbide (TiC), titanium aluminum carbide (TiAlC), tantalum aluminum carbide (TaAlC), tantalum aluminum carbon nitride (TaAlCN), lanthanum (La) doped TiN, and doped TaN.

13. The cross-coupled inverter, as in claim 10, where the FET channel layers have a channel layer thickness between 5 nanometers (nm) and 12 nm.

14. The cross-coupled inverter, as in claim 10, where the left center gate stack and the right center gate stack have a gate stack thickness between 10 nm to about 100 nm.

15. The cross-coupled inverter, as in claim 10, used in one or more of the following circuits: an SRAM cell, a comparator, and a sense amplifier.

16. The cross-coupled inverter, as in claim 10, where the first common S/D is connected to a first external power contact and the second common S/D is connected to a second external ground contact.

17. The cross-coupled inverter, as in claim 10, with no more than the following external connections: the Q external connection, the QB external connection, a first common S/D connection, and a second common S/D connection.

18. A method of making a cross-coupled inverter from a nanosheet stack comprising the steps of:

forming the a nanosheet stack by alternately forming one or more dummy gate layers each with a dummy gate layer thickness and one or more channel layers each with a channel layer thickness, one of the dummy gate layers being a center dummy gate layer with a center dummy layer thickness, the center dummy layer thickness being thicker than the dummy gate layer thickness and one or more of the channel layers being first channel layers that are below the center dummy layer and one or more of the channel layers being second channel layers that are above the center dummy layer;

depositing a pair of dummy gates on a top surface of the nanosheet stack and removing regions of the nanosheet stack to create a left stack and a right stack in a stack pair;

forming inner spacers on each of the one or more dummy gate layers exposed ends to form a spacer stack pair with a left spacer stack and a right spacer stack formed, respectively, from the left stack and the right stacks;

forming a first source drain (S/D) surrounding the spacer stack pair and recessing the first SID so that a first SID top surface is below a center line of the center dummy layer, the first S/D comprising a left first FET S/D on a left side of the left stack, a first common FET S/D between the left spacer stack and the right spacer stack, and a right first FET S/D on a right side of the right spacer stack, the one or more of the first channel layers, being first left channel layers, being electrically connected in parallel between the left first FET S/D and the first common FET S/D and the one or more of the first channel layers, being first right channel layers, being electrically connected in parallel between the right first FET S/D and the first common FET S/D;

depositing an electrically insulating layer on the first S/D;

forming second S/D on the electrically insulating layer that surrounds the spacer stack pair and filling voids above the second SID with an interlayer dielectric (ILD), the second S/D comprising a left second FET S/D on the left side of the left stack, a second common FET S/D between the left spacer stack and the right spacer stack, and a right second FET SID on the right side of the right spacer stack, the one or more of the second channel layers, being second left channel layers, being electrically connected in parallel between the left second FET S/D and the second common FET S/D and the one or more of the second channel layers, being second right channel layers, being electrically connected in parallel between the right second FET S/D and the second common FET S/D;

forming a left gate stack around the first left channel layers and the second left channel layers and forming a right gate stack around the first right channel layers and the second right channel layers;

electrically and internally connecting the first right FET S/D and the second right FET S/D together with a Q external connection;

electrically and internally connecting the first left FET S/D and the second left FET S/D together with a QB external connection;

and electrically connecting the Q external connection externally to the left gate stack and electrically connecting the QB external connection to the right gate stack.

19. The method, as in claim 18, where the first S/D is epitaxially grown and doped with a first dopant and the second S/D is epitaxially grown and doped with a second dopant opposite the first dopant.

20. The method, as in claim 19, where the first S/D is made of silicon-germanium (SiGe) and the first dopant is one or more of the following: boron (B), gallium (Ga), indium (In), and thallium (Tl) and the second S/D is made of silicon (Si) and the second dopant is one or more of the following: phosphorus (P), arsenic (As) and antimony (Sb).

* * * * *